US007279119B2

(12) United States Patent
Hellring et al.

(10) Patent No.: US 7,279,119 B2
(45) Date of Patent: Oct. 9, 2007

(54) SILICA AND SILICA-BASED SLURRY

(75) Inventors: Stuart D. Hellring, Pittsburgh, PA (US); Colin P. McCann, Pittsburgh, PA (US); Suryadevara V. Babu, Pottsdam, NY (US); Yuzhuo Li, Norwood, NY (US); Satish Narayanan, Hillsboro, OR (US); Robert L. Auger, Pittsburgh, PA (US)

(73) Assignee: PPG Industries Ohio, Inc., Cleveland, OH (US)

( * ) Notice: Subject to any disclaimer, the term of this patent is extended or adjusted under 35 U.S.C. 154(b) by 431 days.

(21) Appl. No.: 10/627,776

(22) Filed: Jul. 28, 2003

(65) Prior Publication Data

US 2004/0067649 A1   Apr. 8, 2004

(51) Int. Cl.
*H01I 21/302* (2006.01)
*C09K 5/00* (2006.01)

(52) U.S. Cl. ............... 252/79.1; 252/79.2; 252/79.3; 252/79.4

(58) Field of Classification Search .............. 252/79.1, 252/79.2, 79.3, 79.4
See application file for complete search history.

(56) References Cited

U.S. PATENT DOCUMENTS

| 5,484,581 | A | | 1/1996 | Esch et al. ................... 423/335 |
|---|---|---|---|---|
| 5,720,551 | A | | 2/1998 | Shechter ..................... 366/147 |
| 5,904,159 | A | | 5/1999 | Kato et al. ..................... 134/7 |
| 5,980,775 | A | | 11/1999 | Grumbine et al. .......... 252/79.1 |
| 6,063,306 | A | | 5/2000 | Kaufman et al. ........... 252/79.4 |
| 6,136,711 | A | | 10/2000 | Grumbine et al. .......... 438/692 |
| 6,656,241 | B1 | * | 12/2003 | Hellring et al. ............... 51/308 |
| 2003/0094593 | A1 | | 5/2003 | Hellring et al. |
| 2004/0077295 | A1 | * | 4/2004 | Hellring et al. ............... 451/41 |

FOREIGN PATENT DOCUMENTS

| WO | WO97/45366 | 12/1997 |
|---|---|---|
| WO | WO 00/39056 | 6/2000 |
| WO | WO 02/102910 A1 | 12/2002 |

OTHER PUBLICATIONS

ASTM D 2414-93 "Standard Test Method for Carbon Black—n-Dibutyl Phthalate Absorption Number".
R.B. Anderson and P.H. Emmett, "Measurement of Carbon Black Particles by the Electron Microscope and Low Temperature Nitrogen Adsorption Isotherms", Journal of Applied Physics, vol. 19, Apr. 1948, pp. 367-373.
ASTM D 1993-91 "Standard Test Method for Precipitated Silica-Surface Area by Multipoint BET Nitrogen Adsorption".
French Standard NF T 45-007, "Primary Materials for the Rubber Industry: Precipitated Hydrated Silica", Section 5.12, Method A, pp. 66-76, Nov. 1987.
Lee M. Cook, "Chemical Processes in Glass Polishing", Journal of Non-Crystalline Solids, 1990, 120, 152-171.
Y. Li and S.V. Babu, "Chemical Mechanisms in CMP of Cu and Ta Using Silica Abrasives," Fifth Annual CMP Symposium 2000, Aug. 14, 2000, Lake Placid, New York.
Y. Li, A. Jindal and S.V. Babu, "Role of Chemicals and Abrasive Particle Properties in Chemical-Mechanical Polishing of Copper and Tantalum, Proc." The Electrochemical Society 198$^{th}$ Meeting, Phoenix. Arizona, Oct. 22-27, 2000.
ASTM Standards, Method A of D-280, vol. 06.02 (Reapproved 1987) "Standard Test Methods for Hygroscopic Moisture (and Other Matter Volatile Under the Test Conditions) in Pigments".
John H. Perry, Chemical Engineers Handbook, 4$^{th}$ Edition, McGraw-Hill Book Company, New York (1963), Library of Congress Catalog Card No. 6113168, pp. 8-42 and 8-43.
Warren L. McCabe and Julian C. Smith, "Unit Operations of Chemical Engineering", 3$^{rd}$ Edition, McGraw-Hill Book Company, New York (1976) ISBN 0-07-044825-6, pp. 844-845.
F.E. Albus, "The Modern Fluid Energy Mill," Chemical Engineering Progress, vol. 60, No. 6 (Jun. 1964), pp. 102-106.
Ralph K. Iler, "The Chemistry of Silica," 1979 John Wiley & Sons, Inc., New York, Chapter 5.
U.S. Appl. No. 09/882,548, filed Jun. 12, 2002 "A Silica-Based Slurry".
U.S. Appl. No. 60/401,131, filed Aug. 5, 2002 "A Silica-Based Slurry Composition".
U.S. Appl. No. 60/401,108, filed Aug. 5, 2002 "CMP Composition and Slurry".

* cited by examiner

*Primary Examiner*—George A. Goudreau
(74) *Attorney, Agent, or Firm*—Deborah M. Altman; Carol A. Marmo

(57) ABSTRACT

This invention relates to a silica, a slurry composition, and a method of their preparation. In particular, the silica of the present invention includes aggregated primary particles. The slurry composition which incorporates the silica, is suitable for polishing articles and especially useful for chemical-mechanical planarization of semiconductor substrates and other microelectronic substrates.

19 Claims, No Drawings

SILICA AND SILICA-BASED SLURRY

BACKGROUND OF THE INVENTION

This application claims priority to U.S. patent application Ser. No. 09/882,549 filed Jun. 14, 2001, which application is incorporated herein by reference in its entirety.

SUMMARY OF THE INVENTION

The present invention relates to silica, a silica-based slurry composition, and method of preparation. In particular, the silica includes aggregated primary particles; and the slurry composition which incorporates the silica, is suitable for polishing articles and especially useful for chemical-mechanical planarization ("CMP") of semiconductor substrates and other microelectronic substrates.

In general, a plurality of integrated circuits are formed on a semiconductor substrate to fabricate a semiconductor wafer. The integrated circuits are typically formed by a series of process steps in which patterned layers of materials, such as conductive, insulating and semiconducting materials, are formed on the substrate. The use of copper and tantalum metal interconnects on semiconductor substrates is known in the art. In general, copper serves as an electrically conductive interconnection that is surrounded by an insulating interlayer dielectric material (ILD) such as silicon dioxide, and tantalum serves as a barrier between the copper and the ILD to prevent copper migration into the ILD. CMP is a technique known for removing such metallic materials from a semiconductor substrates. The control of metal removal rates, and selectivity between copper, tantalum, tungsten, aluminum and ILD, for example, is desirable for achieving planarity requirements.

The CMP of a rough surface of an article such as a semiconductor substrate, to a smooth surface generally involves rubbing the rough surface with the work surface of a polishing pad using a controlled and repetitive motion. Thus, the process typically involves rotating the polishing pad and semiconductor substrate against each other in the presence of a fluid. The fluid may contain a particulate material such as alumina, ceria, silica or mixtures thereof. The pad and particulate material act to mechanically planarize the semiconductor substrate, while the fluid and particulate material serve to chemically planarize the substrate and to facilitate the removal and transport of abraded material off and away from the rough surface of the article.

In order to maximize the density of integrated circuits on a semiconductor wafer, it is necessary to have an extremely planar substrate at various stages throughout the semiconductor wafer production process. As such, semiconductor wafer production typically involves at least one, and typically a plurality of planarization steps.

It is known in the art to use alumina and silica abrasives in the CMP process. U.S. Pat. No. 5,980,775 discloses a CMP composition which includes an oxidizing agent, at least one catalyst, at least one stabilizer and a metal oxide abrasive such as alumina or silica. Further, this patent discloses a method for using the CMP composition to polish at least one metal layer of a substrate. U.S. Pat. No. 6,136,711 discloses a CMP composition which includes a compound capable of etching tungsten, at least one inhibitor of tungsten etching, and a metal oxide abrasive such as alumina or silica. Further, this patent discloses a method for using the CMP composition to polish substrates containing tungsten. U.S. Pat. No. 5,904,159 discloses a polishing slurry comprising a dispersed silica which is obtained by dispersing fumed silica particles in an aqueous solvent, wherein the average primary particle size is from 5 to 30 nm, having a light scattering index of from 3 to 6 and a silica concentration of 1.5% by weight, and an average secondary particle size of from 30 to 100 nm on a weight basis.

In general, the use of alumina has been considered desirable in the art because alumina particles have lower chemical reactivity than silica particles on silicon dioxide, and thus, alumina particles demonstrate a higher metal selectivity than silica particles. Without high selectivity, undesirable amounts of the silicon dioxide layer may be polished away with the metal. However, alumina slurries are generally more costly, and more prone to defects than silica slurries. Generally, alumina particles are more difficult to disperse than silica particles. Thus, it is desirable to develop a silica slurry that exhibits controlled removal rates and high selectivity relative to various metallic materials. "Selectivity" as used herein refers to the ratio of removal rates of two or more materials during CMP. For example, the selectivity of copper to tantalum represents the ratio of the removal rate of copper to the removal rate of tantalum.

It has now been found that slurry compositions containing silica having the defined characteristics of the present invention provide performance advantages relative to metal removal rates and selectivity.

In accordance with the present invention, there is provided silica comprising an aggregate of primary particles, said primary particles having an average diameter of at least seven (7) nanometers, wherein said aggregate has an aggregate size of less than one (1) micron; and a hydroxyl content of at least seven (7) hydroxyl groups per nanometer squared. In a non-limiting embodiment, the silica of the present invention can comprise precipitated silica.

The present invention also includes a silica-based slurry comprising said silica of the present invention.

It is noted that, as used in this specification and the appended claims, the singular forms "a," "an," and "the" include plural referents unless expressly and unequivocally limited to one referent.

For the purposes of this specification, unless otherwise indicated, all numbers expressing quantities of ingredients, reaction conditions, and so forth used in the specification and claims are to be understood as being modified in all instances by the term "about." Accordingly, unless indicated to the contrary, the numerical parameters set forth in the following specification and attached claims are approximations that may vary depending upon the desired properties sought to be obtained by the present invention. At the very least, and not as an attempt to limit the application of the doctrine of equivalents to the scope of the claims, each numerical parameter should at least be construed in light of the number of reported significant digits and by applying ordinary rounding techniques.

Notwithstanding that the numerical ranges and parameters setting forth the broad scope of the invention are approximations, the numerical values set forth in the specific examples are reported as precisely as possible. Any numerical value, however, inherently contain certain errors necessarily resulting from the standard deviation found in their respective testing measurements.

The features that characterize the present invention are pointed out with particularity in the claims which are part of this disclosure. These and other features of the invention, its operating advantages and the specific objects obtained by its use will be more fully understood from the following detailed description and the operating examples.

DETAILED DESCRIPTION OF THE INVENTION

Silica can be prepared by various methods known in the art. In general, silica can be prepared by combining an aqueous solution of a soluble metal silicate with an acid. The soluble metal silicate can be an alkali metal silicate such as but not limited to sodium or potassium silicate. The acid can be selected from a wide variety of mineral acids, organic acids, carbon dioxide, or mixtures thereof. The silicate/acid slurry then can be aged. An acid or base can be added to the silicate/acid slurry. The resultant silica particles can be separated from the liquid portion of the mixture. The separated silica can be washed with water, the wet silica product can be dried, and then the dried silica can be separated from residues of other reaction products, using conventional washing, drying and separating methods.

It is known in the art that when silicate polymerizes to a sufficient molecular weight such that the polymer size exceeds one (1) nanometer, discrete silica particles can form. These particles are referred to herein and the claims as "primary particles". Various methods for characterizing primary particles have been described in the art (e.g., "The Chemistry of Silica," Ralph K. Iler, 1979 John Wiley & Sons, New York, Chapter 5).

In alternate non-limiting embodiments, the primary particles can have an average diameter of at least 7 nanometers, or at least 10 nanometers, or at least 15 nanometers. As used herein and the claims, the average diameter of the primary particles of the silica in the present invention can be calculated using CTAB specific surface area. The calculation includes dividing 2720 by the CTAB specific surface area in square meters per gram. This method is analogous to that described in the Iler reference (ibid page 465) for amorphous silica with a skeletal density of 2.2 grams per cubic centimeter.

In a further non-limiting embodiment, the primary particles can be approximately spherical in shape.

Primary particles having a particle size less than about 100 nanometers can demonstrate a tendency to group together and form covalent siloxane bonds between the particles (e.g., "Iler"), in addition to the siloxane bonds within the primary particles. These groups of covalently-bonded primary particles are referred to herein and the claims as "aggregates". Various methods for characterizing aggregates have been described in the art (e.g., "Iler").

In a non-limiting embodiment of the present invention, the bonds between the primary particles of the silica can be sufficiently weak such that the bond(s) can rupture when mechanical shear is applied. Mechanical shear can be applied using a variety of methods known to the skilled artisan. In a non-limiting embodiment, mechanical shear is applied using commercially available equipment such as a conventional homogenizer, Nanomiser™, or Microfluidizer™.

In alternate non-limiting embodiments, the silica of the present invention can include aggregated primary particles having an aggregate size of less than one (1) micron, or less than 0.5 micron. In a further non-limiting embodiment, the bonds between the primary particles of the silica can rupture to provide a dispersion or slurry wherein the aggregate size can be less than one (1) micron, or less than 0.5 micron.

The size of the aggregates can be determined by various methods known to the skilled artisan. In a non-limiting embodiment, the size of the aggregates can be determined by use of a light scattering technique, such as but not limited to a Coulter LS particle size analyzer. As used herein and in the claims, the term "aggregate size" means the diameter of the aggregate based on volume percent as determined by light scattering using a Coulter Counter LS particle size analyzer. In this light scattering technique, the diameter can be determined from a hydrodynamic radius of gyration regardless of the actual shape of the aggregate. As used herein and the claims, the term "average aggregate size" means the average diameter of the aggregate based on volume percent. In a non-limiting embodiment, the average aggregate size can be from 75 to 250 nm.

In a non-limiting embodiment, the silica used to prepare the silica of the present invention, can be such that the aggregates of the primary particles are capable of breaking down into smaller aggregates of primary particles when subjected to a particle size reduction technique. In a further non-limiting embodiment, the process used to prepare the silica can be such that at least a portion of the aggregates that form can break down into smaller aggregates. It is contemplated that the breaking down of aggregates into smaller aggregates can be due to silica aggregates having fewer siloxane bonds between the primary particles.

It is further contemplated that oil absorption can be a measure of the openness of the silica structure and an indication of the susceptibility of silica to undergo particle size reduction. In alternate non-limiting embodiments, at least 50%, or at least 80%, or 100%, of the aggregated primary particles can be reduced to an aggregate size of less than one (1) micron. Oil absorption silica can be determined using a wide variety of methods known in the art. In a non-limiting embodiment, the DBP oil absorption of amorphous precipitated silica can be determined in accordance with ASTM D 2414-93 using dibutyl phthalate as the absorbate. In further non-limiting embodiments, the silica of the present invention can have a DBP oil absorption of at least 150 milliliters per 100 grams of silica, or at least 220 milliliters per 100 grams of silica.

It is further contemplated that inter-particle bridging in some cases can reinforce a silica aggregate and substantially prevent the silica from breaking-down even though the oil absorption is high. Inter-particle bridging can be measured by various methods known in the art. In a non-limiting embodiment, microscopy can be employed to determine a physical measurement of the extent of material bridging between primary particles.

In a non-limiting embodiment, precipitated silica can be used in the present invention. In a further non-limiting embodiment, surface-modified silica can be used. A non-limiting example for use in the present invention can include the surface-modified silica described in U.S. patent application Ser. No. 09/882,548 filed in the USPTO on Jun. 14, 2001; the relevant portions of which are incorporated herein by reference.

In a further non-limiting embodiment, the silica can have a "surface roughness" of at least 1.0 when defined by the ratio of the BET-nitrogen (5-point) surface area to CTAB specific surface area. Surface roughness can be determined using a variety of methods known in the art. In a non-limiting embodiment, the surface roughness can be determined in a manner analogous to the "roughness factor" that was described by Anderson and Emmett as the ratio of BET nitrogen surface area to the surface area determined by electron micrographs [cf. R. B. Anderson and P. H. Emmett *Journal of Applied Physics* 1939, 19, 367]. The surface area by electron micrograph can be substituted by CTAB specific surface area.

The BET surface area can be determined using a variety of methods known in the art. In a non-limiting embodiment, the BET surface area can be determined by the Brunauer, Emmett, and Teller (BET) method according to ASTM D1993-91. In a further non-limiting embodiment, the BET surface area can be determined by fitting five relative-pressure points from a nitrogen sorption isotherm measurement made using a Micromeritics TriStar 3000™ instrument. A FlowPrep-060™ station can provide heat and a continuous gas flow to prepare samples for analysis. Prior to nitrogen sorption, the silica samples can be dried by heating to a temperature of 160° C. in flowing nitrogen (P5 grade) for a minimum of one (1) hour.

The CTAB specific surface area is a measurement of the external surface area of the silica. The CTAB specific surface area can be measured by a variety of methods known in the art. In a non-limiting embodiment, the French Standard Method (i.e., French Standard NFT 45-007, Primary Materials for the Rubber Industry: Precipitated Hydrated Silica, Section 5.12, Method A, pp. 64-71, November 1987) can be used to measure the external specific surface area by determining the quantity of CTAB (CetylTrimethylAmmonium Bromide) before and after adsorption at a pH of from 9.0 to 9.5, using a solution of anionic surfactant Aerosol OT® as the titrant. Various CTAB methods use filtration to separate the silica, however, the French Standard Method uses centrifugation. The quantity of CTAB adsorbed for a given weight of silica and the space occupied by the CTAB molecule can be used to calculate the external specific surface area of the silica. The external specific surface area value can be recorded in square meters per gram. A detailed procedure for determining CTAB is set forth in the Examples herein.

The surface area and surface roughness of silica can vary and can depend on the method and conditions used to prepare the silica. In a non-limiting embodiment, silica can be prepared by employing a precipitation process. Precipitated silica can be prepared using a wide variety of methods and conditions known in the art. For example the temperature and hydroxide concentration can vary depending on the ingredients used and method employed. In a non-limiting embodiment, the silica is prepared at a temperature of from 70 to 100° C. In alternate non-limiting embodiments, the amount of hydroxide added can be such that the silica to hydroxide mole ratio is greater than 2.9, or from 3.3 to 10, or from 4.0 to 6.6. In general, a lower temperature and higher hydroxide content during the precipitation step can produce silica having a high CTAB specific surface area. A higher temperature and a longer period of aging following the precipitation step, generally can reduce or minimize surface roughness of the resultant silica.

The surface roughness of silica can be increased for a given primary particle size by changing precipitation conditions. In a non-limiting embodiment, hydroxide concentration can be increased during the "aging" step (Step I.e., for example, of the process described below) by adding a base such as but not limited to hydroxide. The amount of base added can vary depending on the base selected. In alternate non-limiting embodiments, the amount of hydroxide added can be such that the silica to hydroxide mole ratio is greater than 2.9, or from 3.3 to 10, or from 4.0 to 6.6. The base can be selected from a wide variety of those known to the skilled artisan. Non-limiting examples of suitable bases can include hydroxide, such as but not limited to potassium hydroxide.

In a non-limiting embodiment, an increase in hydroxide concentration can result in a higher BET surface area, and a CTAB specific surface area that is substantially the same or slightly lower. This embodiment can be used to increase the surface roughness of a silica having a low CTAB specific surface area. As used herein and the claims, the term "low CTAB specific surface area" means less than 100 $m^2/g$.

In another non-limiting embodiment, the silicate and acid flow rates can be essentially balanced throughout the silicate and acid addition step (Step I.c., for example, of the process as described below), to maintain a higher silicate to acid flow rate ratio. A higher hydroxide concentration can lower the level of silicate neutralization during the addition step. This method can generally be used to increase the surface roughness of a silica having a high CTAB specific surface area. As used herein and the claims, "high CTAB specific surface area" means greater than 100 $m^2/g$.

In another non-limiting embodiment, the duration of the aging step can be varied to modify the surface roughness of silica (Step II.d., for example, of the process as described below). In a further non-limiting embodiment, a longer aging period for a reaction mixture having a pH of 8.5 or below, can result in a lower surface roughness.

Silica for use in the present invention can be prepared using a variety of methods known to the skilled artisan. In alternate non-limiting embodiments, an essentially solid-form of an alkali metal silicate can be sufficiently dissolved in water to produce an "additive" solution; or a substantially concentrated solution of an aqueous alkali metal silicate can be diluted to obtain the desired concentration of alkali metal in the "additive" solution. As used herein and the claims, the weight amount of alkali metal is analytically reported as "$M_2O$". Non-limiting examples of suitable alkali metal silicates can include lithium silicate, sodium silicate, potassium silicate, and mixtures thereof.

In a non-limiting embodiment, silica preparation can be carried out at a temperature which is sufficiently high to preclude gelation of the reaction mixture. In a further non-limiting embodiment, the temperature at which the preparation process is carried out can be sufficiently low to sufficiently preclude boiling of the reaction mixture and the phase transition to crystallization when the process is conducted in a non-pressurized vessel. In alternate non-limiting embodiments, the temperature can be at least 70° C., or not higher than 100° C.

In another embodiment, the amount of $SiO_2$ and $M_2O$ used in silica preparation can be selected relative to the gelation and crystallization concerns. In alternate non-limiting embodiments, the resultant "additive" solution can contain from 1 to 30 weight percent $SiO_2$, or from 10 to 25 percent by weight $SiO_2$; or from 15 to 20 weight percent $SiO_2$. In further alternate non-limiting embodiments, the "additive" solution can have a $SiO_2:M_2O$ molar ratio of from 0.1 to 3.9, or from 2.9 to 3.5, or from 3.0 to 3.4; or from 3.1 to 3.4.

In a non-limiting embodiment, silica having a low CTAB specific surface area for use in the present invention can be prepared as follows. As aforementioned, as used herein and the claims, the term "low CTAB specific surface area" refers to a value of 100 meters squared per gram or less.

(I.a.) A portion of the "additive" aqueous alkali metal silicate solution can be diluted with water to prepare an "initial" aqueous alkali metal silicate solution.

In alternate non-limiting embodiments, the "initial" solution can contain from 0.1 to 2.0 weight percent $SiO_2$, or from 0.2 to 1.5 weight percent $SiO_2$, or from 0.3 to 1.0 weight percent $SiO_2$. In alternate non-limiting embodiments, the "initial" solution can have a $SiO_2:M_2O$ molar ratio of from 0.1 to 3.9, or from 1.6 to 3.9, or from 2.9 to 3.5, or from 3.1 to 3.4.

(I.b.) An acid can be added to the "initial" aqueous alkali metal silicate solution to neutralize the $M_2O$ present and form a first reaction mixture. In alternate non-limiting embodiments, at least 90%, or at least 100%, or from 95 to 100%, of the $M_2O$ present in the initial aqueous alkali metal silicate solution can be neutralized.

The percent neutralization can be calculated using various methods known in the art. In a non-limiting embodiment, the percent neutralization can be determined by assuming that one (1) equivalent of strong acid neutralizes one (1) equivalent of $M_2O$. For example, one (1) mole (or 2 equivalents) of sulfuric acid neutralizes one (1) mole (or 2 equivalents) of $M_2O$. In alternate non-limiting embodiments, the pH can be adjusted to less than 9.5, or less than 9.0, or 8.5 or less. Suitable acids for use in this neutralization step can include a wide variety of acids known to the skilled artisan. In general, the acid should be strong enough to neutralize the alkali metal silicate. Non-limiting examples of such acids can include but are not limited to sulfuric acid, hydrochloric acid, nitric acid, phosphoric acid, formic acid, acetic acid, and mixtures thereof. In a non-limiting embodiment, sulfuric acid, hydrochloric acid, nitric acid, phosphoric acid or mixtures thereof can be used. In a further embodiment, sulfuric acid can be used.

(I.c.) Another portion of the "additive" aqueous alkali metal silicate solution and acid can be added to the first reaction mixture over a period of time to form a second reaction mixture. The amount of "additive" solution and acid used, and the time period for addition, can vary widely depending on the ingredients selected. In alternate non-limiting embodiments, the "additive" solution used can be such that the amount of $SiO_2$ added is from 0.5 to 30 times, or from 3 to 28 times, the amount of $SiO_2$ present in the "initial" aqueous alkali metal silicate solution. In another non-limiting embodiment, the amount of acid added can be such that at least 90%, or at least 95%, or 100%, of the $M_2O$ contained in the "additive" solution added during the simultaneous addition is neutralized. In another non-limiting embodiment the pH can be maintained at less than 9.5, or less than 9.0, or 8.5 or less. In a non-limiting embodiment, the "additive" and acid can be added simultaneously. In further alternate non-limiting embodiments, the addition can be completed in a period of of from 20 to 180 minutes; or from 30 to 120 minutes; or from 45 to 90 minutes.

Suitable acids for use in this second neutralization step can include a wide variety of acids known to a skilled artisan. As aforementioned, the acid should be strong enough to neutralize the alkali metal silicate. Non-limiting examples of such acids can include but are not limited to sulfuric acid, hydrochloric acid, nitric acid, phosphoric acid, formic acid, acetic acid, and mixtures thereof. In alternate non-limiting embodiments, sulfuric acid, hydrochloric acid, nitric acid or phosphoric acid can be used. In another embodiment, sulfuric acid can be used.

(I.d.1.) In a non-limiting embodiment, acid can be added to the second mixture with agitation to form a third reaction mixture. In a further non-limiting embodiment, the resultant silica can have a low surface roughness. As used herein and the claims, "low surface roughness" refers to silica having a BET surface area to CTAB specific surface area ratio of less than 1.2. The amount of acid used can vary widely depending on the selection of acid. In alternate non-limiting embodiments, the amount of acid can be such that the pH of the third reaction mixture is 9.3 or lower, or from 7.0 to 9.3; or from 7.5 to 9.0. A wide variety of known acids can be used. The acid generally can be selected such that the acid is strong enough to reduce the pH to a value within said pH ranges. Non-limiting examples of suitable acids can include but are not limited to sulfuric acid, hydrochloric acid, nitric acid, phosphoric acid, formic acid, and acetic acid. In a non-limiting embodiment, sulfuric acid, hydrochloric acid, nitric acid or phosphoric acid can be used. In another non-limiting embodiment, sulfuric acid can be used.

(I.d.2.) In another non-limiting embodiment, hydroxide can be added to the second reaction mixture with agitation to form a third reaction mixture. In a further non-limiting embodiment, the resultant silica can have a high surface roughness. As used herein and the claims, "high surface roughness" refers to silica having a BET surface area to CTAB specific surface area ratio of 1.2 or greater. The amount of hydroxide added can vary widely depending on the hydroxide selected. In alternate non-limiting embodiments, the silica to hydroxide mole ratio can be greater than 2.9, or from 3.3 to 10 or from 4.0 to 6.6. Suitable hydroxides for use in the present invention can include those known to the skilled artisan. Non-limiting examples of hydroxides can include but are not limited to ammonium hydroxide, potassium hydroxide, sodium hydroxide, organic ammonium hydroxides, hydroxides of organic amines, and mixtures thereof.

(I.e.) Either of the third reaction mixtures (i.e., for low or high surface roughness) can be aged with agitation. The aging period can vary widely and depends on the selection of ingredients. In alternate non-limiting embodiments, the period of aging can be from 10 to 100 minutes, or from 20 to 90 minutes.

(I.f.) Acid can be added to the third reaction mixture while agitating to form a fourth reaction mixture. The amount of acid added can vary widely. In alternate non-limiting embodiments, the amount of acid can be such that the pH of the fourth reaction mixture is less than 7.0, or from 3.0 to 6.0, or from 3.5 to 4.5. Suitable acids can include a wide variety known to the skilled artisan. As stated previously, the acid used generally should be strong enough to reduce the pH of the mixture to within the specified ranges. Non-limiting examples of such acids can include but are not limited to sulfuric acid, hydrochloric acid, nitric acid, phosphoric acid, formic acid, and acetic acid. In alternate non-limiting embodiments, sulfuric acid, hydrochloric acid, nitric acid, and phosphoric acid can be used. In another non-limiting embodiment, sulfuric acid can be used.

In a non-limiting embodiment, silica for use in the present invention can be prepared according to the following process. In a further non-limiting embodiment, the resultant silica can have a high CTAB specific surface area.

(II.a.) A portion of the "additive" aqueous alkali metal silicate solution can be diluted with water. In alternate non-limiting embodiments, a portion of the "additive" solution can be diluted to produce an "initial" aqueous alkali metal silicate solution containing from 0.1 to 5.0 weight percent $SiO_2$, or from 0.2 to 4.0 weight percent $SiO_2$; or from 0.3 to 3.0 weight percent $SiO_2$. In further alternate non-limiting embodiments, additional hydroxide can be added to this initial aqueous alkali metal silicate solution to adjust the hydroxide content to from 0.02 mol per liter to 0.35 mol per liter, or from 0.02 mol per liter to 0.26 mol per liter; or from 0.03 mol per liter to 0.22 mol per liter.

The hydroxide content of a reaction mixture can be determined by various methods known in the art. In a non-limiting embodiment, a sample of the reaction mixture can be diluted with approximately 100 milliliters of deionized water using 0.645 N hydrochloric acid in the presence of phenolphthalein indicator; and the sample can be titrated. The hydroxide content, in mol per liter, then can be calculated by multiplying the milliliters of 0.645 N HCl used in the above titration, by the normality of the titrant, and dividing by the volume, in milliliters, of the reaction mixture.

(II.b.) A portion of the additive aqueous alkali metal silicate solution and acid can be added to the first reaction mixture thereby forming a second reaction mixture. The period of time for the addition can vary widely. In a non-limiting embodiment, the solution and acid can be added simultaneously. In other alternate non-limiting embodiments, the addition step can be completed over a time period of 20 to 180 minutes, or from 30 to 120 minutes, or from 45 to 90 minutes. In a further non-limiting embodiment, the addition is conducted with agitation. The amount of additive aqueous alkali metal silicate solution used can vary widely. In alternate non-limiting embodiments, the amount of $SiO_2$ added can be from 0.5 to 30 times, or from 3 to 28 times, the amount of $SiO_2$ present in the initial aqueous alkali metal silicate solution established in step (II.a.). In another non-limiting embodiment, the amount of acid added can be such that the hydroxide content established in step (II.a.) is maintained.

(II.c.) Acid can be added to the second mixture to form a third reaction mixture. In a non-limiting embodiment, the addition can be conducted with agitation. In alternate non-limiting embodiments, the amount of acid used can be such that the pH of the third reaction mixture is 9.3 or lower, or from 7.0 to 9.3, or from 7.5 to 9.0. A wide variety of acids may be used in this step. In general, the acid selected should be strong enough to reduce the pH to a value within the aforementioned specified ranges. Non-limiting examples of suitable acids can include sulfuric acid, hydrochloric acid, nitric acid, phosphoric acid, formic acid, and acetic acid. In alternate non-limiting embodiments, sulfuric acid, hydrochloric acid, nitric acid or phosphoric acid can be used. In another non-limiting embodiment, sulfuric acid can be used.

(II.d.) The third reaction mixture can be aged with agitation. The time period for aging can vary widely. In alternate non-limiting embodiments, the third reaction mixture can be aged for a period of from 10 to 120 minutes; or from 20 to 90 minutes.

(II.d.1.) In a non-limiting embodiment, the third reaction mixture can be aged for a time period longer than 30 minutes, or longer than 60 minutes. In a further non-limiting embodiment, the resultant silica can have low surface roughness. As aforementioned, "low surface roughness" as used herein refers to silica having a BET surface area to CTAB specific surface area ratio of less than 1.2.

(II.d.2.) In a further non-limiting embodiment, silica having a high surface roughness can be produced by aging the third reaction mixture. The aging period can vary widely. In alternate non-limiting embodiments, time period for aging can be 120 minutes or less, or 30 minutes or longer. As aforementioned, "high surface roughness" as used herein refers to a silica having a BET surface area to CTAB specific surface area ratio of 1.2 or higher.

(II.e.) Acid can be added to the third reaction mixture while agitating to form a fourth reaction mixture. The amount of acid used can vary widely. In alternate non-limiting embodiments, the amount of acid added can be such that the pH of the fourth reaction mixture is below 7.0, or from 3.0 to 6.0, or 3.5 to 4.5. The acid used in this step can vary widely. As stated previously, the acid can be selected such that the acid is strong enough to reduce the pH of the mixture to within the specified ranges. Non-limiting examples of such acids include sulfuric acid, hydrochloric acid, nitric acid, phosphoric acid, formic acid, and acetic acid. In alternate non-limiting embodiments, sulfuric acid, hydrochloric acid, nitric acid, and phosphoric acid can be used. In another non-limiting embodiment, sulfuric acid can be used.

Silica having a high CTAB specific surface area and silica having a low CTAB specific surface area can be prepared using a variety of methods known in the art. In a non-limiting embodiment, such silica can be prepared as follows.

(III.a.) The silica produced in the fourth reaction mixture can be separated from at least a portion of the liquid of the aged fourth reaction mixture. The separation can be accomplished by one or more techniques known in the art for separating solids from liquid; including but not limited to, filtration, centrifugation, decantation, and the like.

(III.b.) The separated silica can be washed using procedures known in the art for washing solids, including but not limited to, passing water through a filter cake, and reslurrying the silica in water followed by separating the solids from the liquid. One washing cycle or a succession of washing cycles can be employed as desired. A purpose of washing the silica can be to remove salt formed by the various neutralizations to desirably low levels. In alternate non-limiting embodiments, the silica can be washed until the concentration of salt in the dried silica is less than or equal to 2 weight percent, or less than or equal to 1 weight percent.

(III.c.) The washed silica then can be dried using one or more techniques known to a skilled artisan. In alternate non-limiting embodiments, the silica can be dried in an air oven or in a vacuum oven, or the silica can be dispersed in water and spray dried in a column of hot air. The temperature at which drying is accomplished is not critical. In a non-limiting embodiment, the drying temperature can be below the fusion temperature. In a further non-limiting embodiment, the drying temperature can be less than 700° C. In another non-limiting embodiment, the drying process can be continued until the silica has the characteristics of a powder.

In general, dried silica is not completely anhydrous but contains can at least a portion of "bound" water and moisture, which is not bound water, in varying amounts. In a non-limiting embodiment, the dried silica can contain from 1 to 5 weight percent bound water. In another non-limiting embodiment, the dried silica can contain from 1 to 15 weight percent moisture which is not bound water. The latter can be dependent upon the prevailing relative humidity and loss in weight of the sample from vacuum drying. The term "bound water" as used herein and the claims means that water which can be removed by additional heating of the silica at calcination temperatures, such as but not limited to, from 1000° C. to 1200° C.

In a non-limiting embodiment, the bound water value can be used to calculate the number of hydroxyl groups per gram of moisture-free silica. It can be assumed that there are two surface hydroxyls for each mole of bound water. The number of hydroxyl groups per $nm^2$ can be calculated according to the following equation:

$$\text{Hydroxyls per nm}^2 = 2*10^{-18}*N*\text{bound water}*(\text{CTAB specific surface area})^{-1}$$

wherein the bound water can be recorded as moles per gram of silica; the CTAB specific surface area can be meters squared per gram of silica, and N can represent Avogadro's number ($6.023*10^{23}$ hydroxyls per mole).

The surface of silica generally contains hydroxyl groups from siloxane-chain terminating silanols. The number of hydroxyl groups per unit of surface area of silica can vary according to the process used to prepare the silica. In alternate non-limiting embodiments, the number of hydroxyl groups per $nm^2$ is at least 7, or at least 10, or at least 15. In a further non-limiting embodiment, these parameters can be representative of silica prepared by a precipitation process.

The role of hydroxyl groups relative to material removal rates for CMP using a silica-based slurry has been suggested in the art. For example, it has been suggested that the hydroxyl groups of the silica in the slurry bond with hydroxyl groups in the silicon dioxide ILD to chemically facilitate ILD removal (see L. M. Cook, Journal of Non-Crystalline Solids, 1990, 120, 152-171). The affect of hydroxyl groups on copper and tantalum removal rates in CMP using a slurry that contains fumed silica has also been suggested (see Li, Y. and Babu, S. V., "Chemical Mechanisms in CMP of Cu and Ta using Silica Abrasives," Fifth Annual CMP Symposium 2000, Aug. 14, 2000, Lake Placid, N.Y., and Li.; Jindal, A; and Babu, S. V., Role of Chemicals and Abrasive Particle Properties in Chemical-Mechanical Polishing of Copper and Tantalum, Proc. The Electrochemical Society $198^{th}$ Meeting, Phoenix, Ariz., Oct. 22-27, 2000).

The determination of weight percent moisture can be determined using various methods in the art. In a non-limiting embodiment, a method for measuring the loss in weight of the sample resulting from vacuum drying at approximately 105° C. can be used. In a non-limiting embodiment, the procedure described in ASTM Standards, Method A of D-280, Volume 06.02 can be used. A silica sample can be dried at 105±3° C. in a weighing bottle at atmospheric pressure. After a time period of approximately thirty (30) minutes, a vacuum can be engaged and the sample can be dried in vacuo for an additional thirty (30) minutes. The weight loss from the original sample can be the moisture loss, and can be used to calculate weight percent moisture.

The bound water per gram of silica can be determined using a variety of methods known in the art. In a non-limiting embodiment, the following method can be used. The total weight loss per gram of silica can be measured by gravimetric ignition after heating the silica from room temperature to 1150° C. for one hour. The moisture loss (as described above) can be subtracted from the total weight loss. Further, the weight losses per gram of chlorine and sulfur trioxide that occur during ignition also can be subtracted from the total weight loss. Chlorine and sulfur trioxide content can be calculated from chloride salts and sulfate salts content in the silica, respectively. The concentrations of chloride and sulfate salts that are used for this calculation can be determined by x-ray fluorescence measurements on the silica. Thus, the bound water per gram of silica can be calculated by the formula:

Bound water=total weight loss−moisture loss−chlorine loss−sulfur trioxide loss wherein the values for total weight loss, chlorine loss and sulfur trioxide loss can be given per gram of silica and at a temperature of 1150° C. The value for moisture loss can be given per gram of silica and at a temperature of 105° C.

In a non-limiting embodiment, agitation can be employed during silica preparation. The degree of agitation used in the various steps can vary considerably. The agitation employed during the addition of one or more reactants can be such that the reactants are sufficiently dispersed in the mixture to reduce or minimize more than trivial local high concentrations of reactants, and such that silica deposition occurs substantially uniformly. In a further non-limiting embodiment, the agitation employed during aging can be at least sufficient to avoid settling of solids such that silica deposition occurs substantially uniformly throughout the mass of silica particles rather than on those particles at or near the top of a settled layer of particles.

The silica used to prepare the silica of the present invention can be such that the aggregated primary particles can break down into smaller aggregates of primary particles when subjected to a particle size reduction technique. A variety of such reduction techniques are known in the art and can be exemplified by grinding and pulverizing. In a non-limiting embodiment, a wet milling process such as but not limited to a fluid energy milling process can be used for reducing the size of particles. The milling process can include the use of air or superheated steam as the working fluid. Various fluid energy mills have been described in the art (e.g., Perry's Chemical Engineers Handbook, 4th Edition, McGraw-Hill Book Company, New York, (1963), Library of Congress Catalog Card Number 6113168, pages 8-42 and 8-43; McCabe and Smith, Unit Operations of Chemical Engineering, 3rd Edition, McGraw-Hill Book Company, New York (1976), ISBN 0-07-044825-6, pages 844 and 845; F. E Albus, "The Modern Fluid Energy Mill", Chemical Engineering Progress, Volume 60, No. 6 (June 1964), pages 102-106, the relevant disclosures of which are incorporated herein by reference).

In a further non-limiting embodiment, a fluid energy milling process can be used such that the aggregated primary particles of the silica can be suspended in a gas stream and circulated at a high velocity in a circular or elliptical path within a confined chamber. At least partial reduction of the aggregate particle size can occur when the particles strike or rub against the walls of the confining chamber. It is contemplated that at least a portion of the reduction can be caused by inter-particle attrition.

In another non-limiting embodiment, silica can be dispersed by directly contacting the silica with a high-pressure water jet. The resulting aqueous-slurry stream then can be carried into a cavitation chamber, which contains an alternating series of narrow-bore and wide-bore cells. In a further non-limiting embodiment, a second high-pressure water jet can be directed into the cavitation chamber in an opposing flow direction to enhance silica-particle impingement within the cells.

In another non-limiting embodiment, the silica can be prepared by reducing the aggregate size of a silica using a double-jet cell process related to the apparatus and method disclosed in WO 00/39056 and U.S. Pat. No. 5,720,551. The process as disclosed in these references uses a double jet cell to produce emulsions by reducing droplet size in a water-oil mixture.

In a non-limiting embodiment of the present invention, a double-jet cell process can be useful for producing silica for use in a slurry for CMP of semiconductors. In a further non-limiting embodiment, the aggregates in the silica can have an aggregate size of less than one (1) micron. It is believed that such an aggregate size reduces or minimizes wafer scratching. The double-jet cell process can include an apparatus containing two nozzles; each nozzle can deliver a jet of fluid along a path. The nozzles can be oriented essentially opposite one another. A first jet of fluid can be directed toward a second jet of fluid, and the two jets of fluid can interact in a region in an elongated chamber. In alternate non-limiting embodiments, the nozzles can include a liner or coating to reduce wear from the fluid jet. In alternate non-limiting embodiments, the nozzles can be at least partially lined with ceramic, or at least partially coated with alumina, sapphire, or diamond.

In another non-limiting embodiment, said fluid comprises water.

The elongated chamber can be configured to form a stream of fluid from the two jets that follows a path that has essentially the opposite direction from one of the paths of one of the jets. In another non-limiting embodiment, to reduce particle size, the chamber can include one or more reactors, which can have different characteristics (such as but not limited to, inner diameter, contour, and composition). In alternate non-limiting embodiments, twelve (12) or less reactors can used, or four (4) to eight (8) reactors. In a further non-limiting embodiment, seals can be positioned between the reactors. The seals can have different seal characteristics (such as but not limited to, inner diameter). In alternate non-limiting embodiments, the ratio of internal diameter of the seals to that of the reactors can be greater than one (1), or greater than two (2).

In a non-limiting embodiment, the two jets of fluid can be ejected from two nozzle orifices having different diameters. The velocity of one jet of fluid can be dominate and the velocity of the other jet of fluid can be recessive. The ratio of the two jet velocities can affect the mean residence time of any given particle in the elongated chamber. In general, the closer the recessive (or lower) jet velocity is to the velocity of the dominant (or higher) jet, the more flow reversal can occur. The backflow can increase particle impingement, which can particle size reduction of the aggregate in the silica. In a non-limiting embodiment, the internal diameter of a reactor in the elongated chamber can be used to approximate the nozzle size of the recessive jet. In further alternate non-limiting embodiments, the ratio of the orifice diameters of the two nozzles can be greater than 1:1, but less than 2:1, or from 1.05:1 to 1.3:1.

The double-jet cell apparatus can include an outlet port configured near the nozzle which discharges the lower velocity jet. The outlet port can emit a stream of fluid from the elongated chamber. An inlet port can be included in the region of the elongated chamber wherein the nozzle which discharges the high velocity jet is positioned. The inlet port can be used to receive a third fluid, and can discharge the third fluid toward the nozzle discharge of the higher jet velocity. In a non-limiting embodiment of the present invention, the third fluid comprises silica. In a further non-limiting embodiment, the silica can be precipitated silica, or a spray dried silica. In alternate non-limiting embodiments, the third fluid can comprise a gas such as but not limited to air, or a liquid such as but not limited to water. A pressure drop across the nozzle can produce a vacuum at this inlet port.

In alternate non-limiting embodiments, the silica can be fed into the inlet port from a mechanical feeder, such as but not limited to a screw feeder; or the silica can be added into the inlet port by drawing the silica through a feed tube into the inlet port by vacuum. The fluid pressure into the two nozzles can be such that the jets of fluid attain a sufficient velocity to reduce the aggregate size of the silica. In alternate non-limiting embodiments, the pressure can be in excess of 30,000 psig, or in excess of 40,000 psig. In a further non-limiting embodiment, the jets of fluid can be discharged from nozzles with orifices in the range of from 0.1 to 0.15 millimeters.

In a non-limiting embodiment, the jets of fluid can contain chemicals, such as but not limited to polyacrylamide copolymers, that are known to reduce nozzle wear and reduce energy consumption in water-jet technology. In alternate non-limiting embodiments, the jets of fluid can contain other chemicals, such as surfactants and thickeners, to prevent particle flocculation. In another non-limiting embodiment, soluble formulation components can be added to the jets of fluid rather than added to the slurry after particle size reduction of the silica.

In a non-limiting embodiment, a polyvalent cation sequestrant, a corrosion inhibitor, and optionally a thickener, as described later herein, are added to the silica prior to or during the particle reduction process.

In another non-limiting embodiment, the additive(s) can be a substantially solid component which can be mixed with the silica using a conventional technique such as but not limited to a ribbon blender or twin-shell blender, and fed into the double-jet cell through the inlet port for milling, as above-described for the silica feed. In another non-limiting embodiment, the additive(s) can be a liquid-soluble solid, which can be dissolved in a liquid medium such as water and then fed into the double-jet cell by means of the jets of fluid ejected from the nozzles. In a further. non-limiting embodiment, the additive(s) can be a liquid and can be added into the jets of fluid ejected from the nozzles in the double-jet cell process.

The silica can be dispersed without drying by passing the liquefied product through a high-pressure homogenizer to reduce the aggregate size. In a non-limiting embodiment, multiple passes through the homogenizer can be used to optimize the aggregate size. In another non-limiting embodiment, a pre-dispersion of silica in fluid can be subjected to particle size reduction through a homogenizer.

The silica of the present invention can be used to prepare a slurry. As used herein and in the claims, the term "slurry" means a mixture of silica and liquid. In a non-limiting embodiment, the liquid can be water. The slurry of the present invention can include a mixture of more than one silica having various physical and chemical properties. In a further non-limiting embodiment, the slurry of the present invention can include a blend of slurries that contain silicas having various physical and chemical properties.

The amount of silica present in the slurry can vary widely. In alternate non-limiting embodiments, the amount of silica can be at least 0.01 percent by weight or greater, or at least 0.1 percent by weight or greater, or at least 0.5 percent by weight or greater, or from 30.0 percent by weight or less, or 12.0 percent by weight or less.

In a non-limiting embodiment, the slurry can be subjected to ion exchange to reduce the concentration of undesirable metals, including but not limited to, for example sodium, potassium or iron. Cations or anions can be exchanged. Ion exchange can be accomplished by a variety of methods known in the art. In a non-limiting embodiment, ion exchange can be performed by passing the slurry, following particle size reduction, through a bed of ion-exchange resin. Sodium or potassium ions, for example, can be removed by passing the slurry through an acidified cation-exchange resin. In another non-limiting embodiment, undesired ions can be removed by metathesis with other ions by exposing the silica, before particle size reduction, as an aqueous slurry with salts of acceptable ions. In a further non-limiting embodiment, sodium ions can be removed by heating an aqueous precipitated silica slurry with excess potassium chloride; filtering, washing and drying the silica to provide a sodium-reduced silica powder.

In a non-limiting embodiment, a slurry for use in a CMP process can be formulated by the addition of acid. A wide variety of acids known in the art can be used in varying amounts, depending on the selection of acid. Non-limiting examples of suitable acids can include sodium-free acids such as mineral acids, for example sulfuric acid or hydrochloric acid, or organic acid, such as carboxylic acids, diacids, or polyacids, or mixtures thereof. In a further non-limiting embodiment, the acid can be added in an amount such that the pH is greater than 2.

In another non-limiting embodiment, a buffer can be added to the slurry to mitigate pH fluctuations during the CMP process.

Other formulation components also can be added to the slurry to optimize performance for a specific CMP application, such as for removal of specific metals. In alternate non-limiting embodiments, formulation components can include corrosion inhibitors, static etch controllers, accelerators, metal halides such as fluorides, surfactants, metal chelating or complexing agents, oxidizing agents and mixtures thereof.

In a non-limiting embodiment, the slurry of the present invention can include an acid selected from picolinic acid, dipicolinic acid, quinolinic acid or mixtures thereof. The amount of acid present in the invention may vary widely depending on the particular acid selected. In a non-limiting embodiment, the amount can be sufficient to increase the metal polishing rates of the substrate. In alternate non-limiting embodiments, the acid can be present in an amount of from 0.01 percent or greater by weight of the slurry composition, or 0.2 percent by weight or greater, or 0.4 percent by weight or greater. In further alternate non-limiting embodiments, the acid can present in an amount of from 5.0 percent by weight or less, or 3.0 percent by weight or less.

In another non-limiting embodiment, the slurry of the present invention can include an oxidizing agent. The oxidizing agent can be useful for oxidizing the substrate metal layer(s) to its corresponding oxide, hydroxide, or ions. In a non-limiting embodiment, an oxidizing agent can be used to oxidize titanium to titanium oxide, tungsten to tungsten oxide, copper to copper oxide, and aluminum to aluminum oxide. The oxidizing agent-containing slurry can be useful to polish metals and metal based components including but not limited to titanium, titanium nitride, tantalum, tantalum nitride, copper, tungsten, tungsten nitride, aluminum, aluminum alloys such as aluminum/copper alloys, gold, silver, platinum, ruthenium, and various mixtures and combinations thereof.

A wide range of oxidizing agents can be used in the present invention. Suitable oxidizing agents can include inorganic and organic per-compounds, and compounds containing an element in its higher or highest oxidation state. As used herein and the claims, the term "per-compound" means a compound containing at least one peroxy group (—O—O—). Non-limiting examples of compounds containing at least one peroxy group can include hydrogen peroxide and its adducts such as but not limited to urea hydrogen peroxide and percarbonates, organic peroxides such as but not limited to benzyl peroxide, peracetic acid, and di-t-butyl peroxide, monopersulfates ($SO_5$), dipersulfates ($S_2OO$), sodium peroxide, and mixtures thereof.

Non-limiting examples of oxidizing agents containing an element in its higher oxidation state can include, but are not limited to, bromic acid, bromate salts, chloric acid, chlorate salts, chromate salts, iodic acid, iodate salts, periodic acid, periodate salts, perbromic acid, perbromate salts, perchloric acid, perchlorate salts, perboric acid, perborate salts, permanganate salts, cerium (IV) compounds such as ammonium cerium nitrate, iron salts such as nitrates, sulfates, EDTA, and citrates, potassium ferricyanide, vanadium trioxide and the like, and aluminum salts.

In a non-limiting embodiment, the oxidizing agent can be urea-hydrogen peroxide, hydrogen peroxide, or a mixture thereof. In another non-limiting embodiment, the oxidizing agent can be hydrogen peroxide.

The amount of oxidizing agent can vary widely depending on the particular oxidizing agent selected. In general, the amount should be sufficient for oxidizing the substrate metal layer, or layers, to its corresponding oxide, hydroxide, or ions. In alternate non-limiting embodiments, the oxidizing agent can be present in the slurry in an amount of from 0.001 percent by weight or greater, or 0.01 percent by weight or greater, or from 20.0 percent by weight or less, or 17.0 percent by weight or less, or 10.0 percent by weight or less.

In another non-limiting embodiment, the slurry of the present invention can include a polyvalent cation sequestrant. Suitable polyvalent cation sequestrants for use in the present invention can include various known compounds which bind to, complex with or otherwise sequester polyvalent metal cations. Non-limiting examples of polyvalent cation sequestrants can include carboxylic acids and polycarboxylic acids, amino acids, dipeptides and polyamino acids, polyimines, phosphoric acids and polyphosphoric acids. Further non-limiting examples can include glycine, histidine, aspartic acid, phytic acid, thermal polyaspartates, γ-amino-n-butyric acid, β-alanine, L-asparagine, 2-aminoisobutyric acid, citric acid, N-(phosphonomethyl)iminodiacetic acid, poly(dimethylsiloxane)-graft-polyacrylic acid, 4,5-imidazoledicarboxylic acid, aminotri(methylenephosphonic acid), polyethylenimine, acetic acid, aspartic acid-phenylalanine methyl ester, and 2-phosphono-1,2,4-butanetricarboxylic acid, a crosslinked polyacrylic acid commercially available from B.F. Goodrich under the tradename Carbopol, a polyacrylate commercially available from B.F. Goodrich under the tradename GOOD-RITE K-700, and mixtures thereof. In a non-limiting embodiment, Carbopol or GOOD-RITE K-700 can be used.

The polyvalent cation sequestrant can be present in an amount such that the copper polish rates are enhanced and static etch, corrosion, pitting, staining, instability of the silica dispersion, or disposal issues are not unduly increased. In alternate non-limiting embodiments, the silica-based slurry comprises a polyvalent cation sequestrant in an amount of from greater than 0 to 5% by weight, or from 0.001 to 1 percent by weight of the slurry composition.

In another non-limiting embodiment, the slurry of the present invention can include an anticorrosion agent or corrosion inhibitor. The corrosion inhibitor for use in the present invention can include a variety of known compounds which inhibit the corrosion or static etch rate of copper, such as but not limited to polycarboxylic acids, polyamino acids, amino acids, imines, azoles, carboxylated azoles, and mercaptans. Non-limiting examples of suitable corrosion inhibitors include benzotriazole, 4-carboxybenzotriazole, 5-carboxybenzotriazole, thermal polyaspartates, histidine, mercaptobenzotriazole, phytic acid, a crosslinked polyacrylic acid commercially available from B.F. Goodrich under the tradename Carbopol, a polyacrylate commercially available from B.F. Goodrich under the tradename GOOD-RITE K-700, and mixtures thereof.

In a non-limiting embodiment, phytic acid can be used in the present invention in varying amounts. In a further non-limiting embodiment, the amount of phytic acid can be such that it constitutes at least 0.01 percent by weight of the slurry, or at least 0.05 percent-by-weight, or from 0.05 to 0.1 percent by weight, or less than 0.2 percent by weight. Non-limiting examples of suitable commercially available phytic acid include water soluble corrosion inhibitors commercially available from King Industries, Incorporated, under the trade names of CDI 4302, 4303, and 4304, and CDX 2128 and 2165.

In a non-limiting embodiment, the corrosion inhibitor can be present in an amount such that static etch, corrosion and pitting are adequately decreased; copper polish rates are not unduly decreased; and staining, instability of the silica dispersion, excessive cost or disposal issues are not unduly increased.

In an embodiment, the corrosion inhibitor for use in the present invention can serve as a passivation film forming agent which forms a passivation layer on the surface of the substrate to be polished. The corrosion inhibitor forms a passivation layer on the surface of an electrical substrate layer. Once a passivation layer is formed, the passivation layer then can be disturbed to obtain a desirable polishing rate. The corrosion inhibitor can include a compound or combination of compounds that are capable of facilitating the formation of a passivation layer of metals and dissolution-inhibiting layers on the surface of a metal layer. Passivation of the substrate metal surface layer can prevent metal surface wet etching. Such film forming agents include nitrogen-containing heterocyclic compounds, wherein the compound comprises at least one 5 or 6 member heterocyclic ring with nitrogen as part of the ring. Examples of such nitrogen-containing 5 and 6 member ring compounds include 1,2,3-triazole, 1,2,4-triazole, benzotriazole, benzimidazole and benzothiazole and their derivatives with hydroxy, amino, imino, carboxy, mercapto, nitro- and alkyl-substituted groups, urea, and thiourea, and mixtures thereof. In an embodiment of the present invention, the passivation film forming agent comprises benzotriazole ("BTA"), 1,2,3-triazole, 1,2,4-triazole, and mixtures thereof.

In alternate non-limiting embodiments, the corrosion inhibitor or passivation film forming agent can comprise from greater than 0 to about 0.5 percent by weight of the silica-based slurry composition, or at least 0.001 percent by weight or greater, or at least 0.01 percent by weight or greater, or at least 0.1 percent by weight or greater, or less than 1 percent by weight, or less than 0.5 percent by weight, or less than 0.05 percent by weight.

The formation of a passivation layer of metals and dissolution-inhibiting layers on the surface of a metal layer of the substrate can be useful to minimize or prevent metal surface wet etching.

In another non-limiting embodiment, the slurry of the present invention can include a thickener. Suitable thickeners can include a compound which stabilizes the silica-based slurry to reduce settling, such as but not limited to polyvinyl alcohols, polyacrylic acids, polysaccharides, hydroxy ethyl cellulose and modified hydroxyethylcellulose, polyethylene glycols, polypropylene glycols, copolymers of polyethylene and polypropylene glycols, alkylated polyethylene and polypropylene glycols, polyethylene imines, polyamino acids, polyacrylamides, and polyamic acids. Non-limiting examples of such suitable anionic polymers can include a crosslinked polyacrylic acid commercially available from B.F. Goodrich under the tradename Carbopol, a polyacrylate commercially available from B.F. Goodrich under the tradename GOOD-RITE K-700, Kelzan AR xanthan gum polysaccharide which is commercially available from CP Kelco, Natrosol 250 MMR hydroxyethylcellulose which is commercially available from Hercules, Airvol 523 polyvinyl alcohol which is commercially available from Air Products, and Polyox 3333 polyethylene oxide which is commercially available from Union Carbide, or mixtures thereof.

The thickener can be present in an amount such that the settling rate is adequately decreased, but viscosity is not unduly increased such that pumpability and filterability is compromised, or heat build during polishing becomes deleterious to the slurry performance. The amount of thickener used can vary depending on the thickener selected. In alternate non-limiting embodiments, the thickener can be present in an amount of from greater than 0 to 5% by weight, or from 0.001 to 1% by weight. In a further non-limiting embodiment, Carbopol can be present as a thickener in an amount of less than 0.5% by weight.

In a further non-limiting embodiment, the thickener can be shear-stable. As used herein and the claims, the term "shear-stable" means that under the shear of polishing, the viscosity of the thickener will not sufficiently decrease (e.g., will decrease by not more than 75% of the viscosity prior to polishing).

In alternate non-limiting embodiments of the present invention, a polyvalent cation sequestrant, corrosion inhibitor, and optionally thickener can be added to the silica during the milling of the silica and/or when the particle size of the silica is reduced, as previously described herein; or milling and/or particle reduction of the silica has been completed.

In a non-limiting embodiment of the present invention, a polyvalent cation sequestrant, a corrosion inhibitor, and optionally a thickener, can be added to the slurry. In a further non-limiting embodiment, the polyvalent cation sequestrant, corrosion inhibitor and/or thickener are combined under mild agitation and then added to the slurry.

In another non-limiting embodiment, the slurry of the invention can include at least one stopping compound. The stopping compound can interact with a metal layer, an adhesion layer, and/or a dielectric layer of the substrate and suppress the removal rate of the layers underlying the layer being polished. The result can be such that the slurry polishes a first layer of a substrate and can be essentially stopped from polishing a second layer that is beneath the first layer. Suitable stopping compounds for use in the present invention can include a wide variety known in the art such as but not limited to polar compounds or polymers that contain polar moieties such as hydroxyl, amino, nitrogen-containing heterocycles, carboxyl, carbonyl, ethereal, sulphonyl, or phosphonyl moieties. Non-limiting examples can include polyvinyl alcohols, polyvinylpyrrolidones, polyvinylpyridines, polyethylene oxide, glycols or polyglycols, polycarboxylic acid derivatives, such as polyacrylic acid polymethyl acrylates. The term "essentially stopped" as used herein and the claims means that the polishing composition or slurry has a first layer to second layer polishing selectivity of about 5:1, or at least 10:1, or 100:1. The selection of the stopping compound can be dependent on its chemical stability, interaction with other components of the slurry, and its effect on the colloidal stability of any abrasive particles employed.

In a non-limiting embodiment, the silica can be present in the slurry of the present invention in an amount of from 0 to 20.0 percent by weight, the anticorrosion agent can be present in an amount of from 0 to 1 percent by weight, and the stopping compound can be present in an amount of from 0 to 1 percent by weight.

In another non-limiting embodiment, the slurry can include a dispersant. Non-limiting examples of suitable dispersants include polycarboxylic acids such as polyacrylic acids, crosslinked polyacrylic acids and polymethacrylic acids; phosphonic acids such as but not limited to alkylphosphonic acids, arylphosphonic acids, polyphosphonic acids, and alkylaminophosphonic acids; polyaminoacids such as but not limited to polyaspartic acids.

In another non-limiting embodiment, the slurry can include a surfactant. Suitable surfactants for use in the present invention can include cationic, anionic and non-ionic surfactants. Suitable cationic surfactants can include but are not limited to aliphatic amines and aliphatic ammonium salts. Non-limiting examples of anionic surfactants can include carboxylic acid salts such as but not limited to fatty acid soaps, alkylether carboxylates, salts of alkyl and aryl sulfonic acids such as from alkylbenzenesulfonic acid, alkylnaphthalenesulfonic acid, and alpha-olefinsulfonic acids. Non-limiting examples of anionic surfactants can include but are not limited to salts of sulfonic acid esters such as higher alcohol sulfonic acid esters, alkylether sulfonic acids, and sulfonic acid ester salts of poyoxyethylene alkylphenylethers. In a non-limiting embodiment, anionic surfactants can include salts of phosphoric acid esters such as but not limited to alkyl phosphoric and arylphosphoric acid esters. Non-limiting examples of nonionic surfactants can include but are not limited to ethers such as polyethylene alkylethers, ether esters such as polyoxyethylene ethers of glycerin esters, and esters such as glycerin esters, and sorbitan esters.

In a non-limiting embodiment, the slurry of the present invention can include a stabilizer. Suitable stabilizers can include acetanilide, tin oxides, and free radical inhibitors such as but not limited to inorganic and organic nitrogen oxides.

In a non-limiting embodiment, the oxidizing agent and other non-abrasive components can be mixed into an aqueous medium, such as deionized or distilled water, under shear conditions until such components are sufficiently dissolved in the medium. Silica then can be added to the medium. In a non-limiting embodiment, the silica can be precipitated silica. The composition then can be dispersed in a liquid such as water to prepare the slurry of the present invention.

The slurry of the present invention can be used to polish a substrate such as but not limited to a microelectronic substrate. In a non-limiting embodiment, the slurry can be used to polish a substrate including a metal layer covering one or more adhesion layers, which in turn covers one or more dielectric layers. The dielectric layer can cover a second metal layer, which can cover a second adhesion layer, which can cover a second dielectric layer, and so forth, to give a built-up substrate. The slurry of the present invention can be useful for polishing one or a combination of the layers comprising the substrate. In a non-limiting embodiment, the slurry of the present invention can be used to polish the metal layer, and/or adhesion layer, and/or dielectric layer of the substrate. In a further embodiment, the slurry of the present invention can be used to polish two or more of the layers. In a further non-limiting embodiment, the polishing slurry is not removed from the substrate in-between layers.

When used to polish a substrate, the slurry of the present invention can be applied to the substrate and the substrate can be polished by conventional means using various polishing machines and polishing pads known in the art. In alternate non-limiting embodiments, the polishing pad can be abrasive-free or it can include an abrasive embedded into or onto the polishing pad. Non-limiting examples of suitable polishing machines can include IPEC 472, Applied Materials Mirra Mesa or Reflexion, Speedfam 676, Novellus Momentum, Lam Terres and Nikon CMP System NPS 2301.

Non-limiting examples of suitable polishing pads can include Rodel's IC1400, IC1000 stacked on a SUBA IV or Polytex, or PPG's FastPad.

In a non-limiting embodiment, upon completion of the polishing process using the slurry, the substrate can be washed with deionized water or other solvents or cleaning solutions to remove the polishing slurry from the substrate.

In alternate non-limiting embodiments, the polishing slurry can be applied directly to the substrate, to a polishing pad, or to both during substrate polishing. In a further non-limiting embodiment, the polishing slurry can be applied to the pad, the pad then can be placed against the substrate, and the pad can be moved in relationship to the substrate to achieve substrate polishing.

The slurry of the present invention can be especially useful for polishing a substrate containing copper, titanium, titanium nitride, tantalum, tantalum nitride, tungsten, and tungsten nitride layers. The slurry of the present invention can be used to provide effective polishing at desired polishing rates while minimizing surface imperfections and defects. Furthermore, the polishing composition and slurry of the present invention can be especially useful to provide a high material removal rate during polishing while maintaining a low static etch rate to minimize dishing and erosion of imbedded features.

In a non-limiting embodiment, the slurry of the present invention can comprise from 0.4 to 2% by weight of picolinic acid, from 3 to 6% by weight of hydrogen peroxide, from 4 to 10% by weight of precipitated silica abrasive, from 0 to 0.02% by weight of benzotriazole, and from 0 to 0.1% by weight of histidine; at a pH of from 5 to 6. The slurry of this embodiment can be useful for polishing copper at a high rate of removal with a low rate of removal of the underlying tantalum layer, while maintaining a low copper static etch in order to minimize surface defects, dishing and erosion of the copper features.

In an embodiment, the slurry of the present invention comprises from 0.4 to 2% by weight of picolinic acid, from 6 to 12% by weight of precipitated silica abrasive, and from 0 to 0.02% by weight of benzotriazole; at a pH from 5 to 6. The slurry in this embodiment can be useful for polishing copper at a low rate of removal with a higher rate of removal of the underlying tantalum layer.

In another non-limiting embodiment,the slurry of the present invention can be used for CMP of dielectric materials, such as interlayer dielectrics (ILD) used in microelectronic devices, such as metal oxide semiconductors (MOS), complementary-MOS (CMOS), dynamic random access memory (DRAM), among others. Various process methods for manufacturing these devices are known in the art and can include but are not limited to damascene, dual damascene, and shallow trench isolation. Non-limiting examples of materials suitable for the ILDs can include but are not limited to silicon dioxide, or metal-doped silicon dioxide such as with boron or phosphorus in borophosphate silica glass (BPSG). Silicon dioxide type ILD can be produced by various methods known in the art such as chemical vapor deposition (CVD), or plasma-enhanced CVD, high density Plasma CVD, or thermal oxidation. Further non-limiting examples of ILD materials can include spin-on glasses (SOG) or polymeric materials such as polyimides. In a non-limiting embodiment, the ILD material can include siliconbased materials such as Black Diamond™, fluorine-doped silicate, carbon-doped oxides (e.g., carbon-doped $SiO_2$), CORAL™, xerogels, or silisesquioxanes such as hydrogen silisesquioxanes and organo silisesquioxanes. Non-limiting examples of carbon-based ILDs can include but are not limited to paralyene, SILK™, amorphous carbon or fluorocarbon, diamond-like carbon or fluorocarbon, or mixtures thereof.

The present invention is more particularly described in the following examples, which are intended to be illustrative only, since numerous modifications and variations therein will be apparent to those skilled in the art. Unless otherwise specified, all parts and all percentages are by weight.

In the following examples, all polishing experiments were performed using a commercially available bench-top polisher model DAP-V™ from Struers The copper and tantalum disks used in these experiments were 3 mm thick, 99.99% pure and had a diameter of 1.25 inches. Unless stated otherwise, the table speed was maintained at 90 rpm, the slurry feed rate was 60 milliliters per minute, and polishing pressure was 6.3 psig. The slurry was continuously stirred in the supply tank using a magnetic stirrer to maintain a good dispersion. The polishing pad used was either a Suba 500 or IC 1400, both of which are available from Rodel. The pad was hand-conditioned for 1 minute using 220 grit sandpaper before every polishing run. The. polish rates were determined by measuring the weight of the disk before polishing and after polishing for 3 minutes. The polish rates reported were obtained by averaging the polish rates obtained over 3 to 5 repeated polishing runs.

EXAMPLES

For each of the examples, an additive silicate solution was prepared by diluting commercially available concentrated aqueous potassium silicate with deionized water to the $K_2O$ concentration that is specified in each example. The concentrated aqueous silicate solution generally was received with a composition of 30 weight percent $SiO_2$ and a $SiO_2$:$K_2O$ molar ratio of 3.25. Unless otherwise specified, the acid used in each of these examples was sulfuric acid.

As used in the present specification and claims, the CTAB specific surface area of the amorphous precipitated silica is the CTAB specific surface area determined in accordance the following procedure: Using an analytical balance, 11.0 grams (g) of cetyltrimethylammonium bromide, also known as CTAB and as hexadecyltrimethylammonium bromide [CAS 57-09-0], was weighed to the nearest one-tenth milligram and the weight expressed in grams,C, was recorded. The weighed CTAB was dissolved in distilled water and diluted with distilled water to 2 liters in a volumetric flask to form a standard CTAB solution was stored in the dark for at least 12 days before use. Using an analytical balance, 3.70 grams of Aerosol® OT, sodium di(2-ethylhexyl) sulfosuccinate, [CAS 577-11-7] was weighed. The weighed Aerosol® OT was dissolved in distilled water and diluted with distilled water to 2 liters in a volumetric flask to form a standard Aerosol® OT solution which was stored in the dark for at least 12 days before use. The useful storage lives of the standard CTAB solution and the standard Aerosol® OT solution are two months after the 12 day storage period. Using a pipet, 10.0 milliliters (mL) of the CTAB standard solution was transferred to a 250 mL Erlenmeyer flask containing a stirring bar. Next, 30 mL chloroform, 50 mL distilled water, 15 drops of 0.02% bromophenol blue aqueous indicator solution, and one drop of 1N aqueous NaOH solution were added to the flask. With vigorous stirring but minimal splashing, the contents of the Erlenmeyer flask were titrated with the standard Aerosol® OT solution from a 50 mL buret. The titration was begun at a rapid drop rate (the stopcock was never wide open) down to about 25 to 30 mL and then more slowly, dropwise, to the end point which occurred at about 37.5 mL. The approach to the end point was characterized first by a milky blue color throughout. Then, as the end point was more closely approached, the bottom chloroform layer became a more intense blue and the top aqueous layer took on a lilac or purple hue. Immediately before the end point, the vigorously stirred mixture became visibly clearer (i.e., less "milky"), and the bottom layer was seen as a very intense blue.

Using a wash bottle, the inside of the flask was washed down with no more than 25 mL of distilled water. The stirrer speed was increased to resume vigorous mixing for efficient contacting of the two liquid phases. At least 10 seconds were allowed to elapse after each dropwise addition of titrant immediately prior to the endpoint. Stirring was stopped frequently to allow the phases to separate so that the analyst could observe these color changes and then vigorous stirring was resumed. At the end point, the bottom phase lost all color and displayed a colorless or milky white appearance while the top phase was intensely purple. The titrated volume was recorded to the nearest 0.01 mL. The titration of the standard CTAB solution was performed at least two times (the titrant volume must agree within 0.05 mL) and the average volume of standard Aerosol® OT solution used per titration, $V_1$, was recorded.

A 200 ml wide mouth glass bottle was tared and approximately 0.500 gram of silica sample (in the as-received state, not dried) was placed in the bottle and weighed to the nearest 0.1 mg. This silica sample weight, S, was recorded. One hundred milliliters of the standard CTAB solution was pipetted into the bottle by using a 50 mL pipet, filling and delivering twice; and a stirring bar was carefully added. The mouth of the bottle was covered with aluminum foil, and the contents were stirred gently for 15 minutes without pH adjustment. Using a pH electrode, the pH was adjusted to between 9.0 and 9.5 using 1N aqueous NaOH added dropwise. When the pH had been stabilized between 9.0 and 9.5, the mouth of the bottle was covered again with aluminum foil or equivalent to retard evaporation loss. The mixture was stirred gently for one hour at pH 9.0 to 9.5. The silica-liquid mixture was transferred to centrifuge tubes, and the mixture was centrifuged for 30 minutes to produce a clear centrifugate. Clear centrifugate was carefully withdrawn using a dropping pipet and transferred to a small, dry glass bottle. Using a pipet, 10.0 mL of the centrifugate was transferred into a 250 mL Erlenmeyer flask containing a stirring bar. Next, 30 mL chloroform, 50 mL distilled water, and 15 drops of 0.02% bromophenol blue aqueous indicator solution were added to the flask. The contents of the Erlenmeyer flask were titrated with the standard Aerosol® OT solution from a 50 mL buret using the same procedure and to the same endpoint used in titrating the standard CTAB solution. The volume of standard Aerosol® OT solution used, $V_2$, was recorded to the nearest 0.01 mL.

A small glass bottle and cap were heated for at least 30 minutes at 105° C. in a vacuum oven. The bottle and cap were then cooled in a desiccator. The bottle and cap were weighed to the nearest 0.1 milligram (mg), as used herein is the tare weight. Approximately one gram of silica sample was added to the bottle, the cap was placed on the bottle, and their combined weight was recorded to the nearest 0.1 mg. The cap was removed and the sample-containing bottle and cap were heated for 30 minutes at 105° C. in a vacuum oven. After introducing vacuum, heating was continued for an additional 30 minutes. The bottle and cap were then cooled in a desiccator. The weight of the bottle containing the sample was recorded to the nearest 0.1 mg. The tare weight was subtracted from the weight in grams of the silica before heating, A, and the weight in grams of the silica after heating, B.

The CTAB specific surface area (dry basis), $A_{CTAB}$, expressed in m$^2$/g, is calculated according to the formula:

$$A_{CTAB} = \frac{(V_1 - V_2)\ (C)\ (A)\ (28.92)}{(V_1)\ (S)\ (B)}$$

Examples for Silica with Low Surface Area and Low Surface Roughness

Example 1

An initial aqueous potassium silicate solution was prepared by heating water (75 liters) to a temperature of 205° F. (96° C.), and adding an additive aqueous potassium silicate (1.2 liters, 118.8 gm K$_2$O/liter). The stirred solution was adjusted to a pH of 8.5 by adding concentrated sulfuric acid. After 5 minutes, additive potassium silicate solution (31.7 liters) and concentrated sulfuric acid (2.16 liters) were added simultaneously over a period of 45 minutes. The resulting slurry was stirred at a temperature of 205° F. for an additional 80 minutes. Acid was then added to reduce the pH of the slurry from 8.5 to 4.2. A portion of the product slurry was filtered and washed with water. The resulting filtercake was liquefied by using high shear from a Cawles™ blade on an overhead mixer, and the resulting slurry was adjusted to a pH 6.3. A portion of this slurry was spray dried to produce a white powder having a weight percent moisture of 3.27. Analysis of this powder showed the following properties: Nitrogen BET (5-point) 89 m$^2$/g; CTAB 89 m$^2$/g; 243 ml of dibutyl phthalate per 100 gm of anhydrous powder. From these CTAB data the average primary particle diameter is calculated to be 30 nanometers. The calculated surface roughness is 1.0.

Particle size reduction was conducted using a double-jet cell that contained an elongated chamber of alumina reactors (6 reactors, 1 mm ID) and alternating Ultra-high molecular weight polyethylene (UHMWPE) seals (2.6 mm ID). Water was pressurized (45,000 psig) and passed through two opposing nozzles (0.1 mm ID and 0.13 mm ID) to produce water jets that entered this elongated chamber from opposite directions. A portion of the spray dried powder was introduced into this double-jet cell between the dominant water jet (from the 0.13 mm ID nozzle) and the elongated chamber. The slurry effluent was discharged at atmospheric pressure from this double-jet cell through an opening between the recessive water jet (from the 0.1 mm nozzle) and the elongated chamber. This slurry contained 8.71 weight percent, and the aggregate particle size was characterized by laser light scattering as follows: average 0.219 microns; median 0.181 microns.

A portion of the slurry was diluted with deionized water to 5.4 weight percent solids and formulated for copper and tantalum polishing evaluation with a Struers DAP-V™ and a polishing pad (SUBA 500™) manufactured by Rodel. The formulations and metal removal rates are shown in Table 1 below:

TABLE 1

| Sample Chemicals Added | pH | Copper Removal Rate (nm/min) | Tantalum Removal Rate (nm/min) | Copper: Tantalum Selectivity |
|---|---|---|---|---|
| A1 None | 5.5 | 0 | 53 | 0.0 |
| B1 5% wt. Hydrogen peroxide | 5.5 | 53 | 45 | 1.2 |
| C1 5% wt. Hydrogen peroxide 1% wt. Glycine | 5.5 | 695 | 7 | 99.3 |
| D1 0.005 M Ferric Nitrate | 2.4 | 161 | 49 | 3.2 |

Example 2

A second batch of silica was prepared using the aforementioned procedure in Example 1, with the exception that the amounts of the following reactants were varied. The amount of additive aqueous potassium silicate added to prepare the initial potassium silicate solution was 1.2 liters of 105.7 gm K$_2$O/liter; and the amount of concentrated sulfuric acid added during the simultaneous addition step was 1.92 liters.

Analysis of the resulting white silica powder showed the following properties: Nitrogen BET (5-point) 108 m$^2$/g; CTAB 91 m$^2$/g; 269 ml of dibutyl phthalate per 100 gm of anhydrous powder. From these CTAB data the average primary particle diameter is calculated to be 30 nanometers. The calculated surface roughness is 1.2.

Particle size reduction was conducted on a portion of the silica using the aforementioned process in Example 1. The resulting slurry was 9.10 weight percent solids, and the aggregate particle size was characterized by laser light scattering as follows: average 0.205 microns; median 0.165 microns; and 10 volume percent greater than 0.401 microns. The volume percent of particles greater than 1.05 microns was 0.

Example 3

A particle size reduction of a portion of the second batch of silica (Example 2) was conducted by using a conventional homogenizer. A portion of the filtercake was liquefied with high shear and diluted with water to 10 percent solids at pH 4. The particle size for this slurry was characterized by laser light scattering as follows: average 31.53 microns; median 27.06 microns; and 10 volume percent greater than 58.65 microns. The volume percent of particles greater than 1.05 microns was 100. This slurry was pressurized and passed through an APV LAB 1000 Gaulin-type homogenizer that was fitted with a tungsten-carbide valve and seat, with the gap adjusted to provide about 12,500 psig of back-pressure. The aggregate particle size for this slurry was characterized by laser light scattering as follows: average 0.253 microns; median 0.194 microns; and 10 volume percent greater than 0.481 microns. The volume percent of particles greater than 1.05 microns was 0.851.

The single-pass slurry was pressurized and passed through an APV LAB 1000 Gaulin-type homogenizer that was fitted with a tungsten-carbide valve and seat with the gap adjusted to provide about 13,000 psig of back-pressure. This product slurry was 9.24 weight percent solids, and the aggregate particle size was characterized by laser light scattering as follows: average 0.241 microns; median 0.200 microns; and 10 volume percent greater than 0.464 microns. The volume percent of particles greater than 1.05 microns was 0.0.

Comparative Example 4

A comparison was made using silica slurries of Examples 2 and 3 which represent two particle-size reduction methods (average particle sizes 0.205 and 0.21 microns, respectively). Formulations of 5 weight percent $H_2O_2$ with 5.4 weight percent silica at a pH of 4. The results are shown in Table 2 below.

TABLE 2

| Pressure Psig | Velocity RPM | Slurry of Example 3 Copper Removal Rate (nm/min) | Slurry of Example 4 Copper Removal Rate (nm/min) | Slurry of Example 3 Tantalum Removal Rate (nm/min) | Slurry of Example 4 Tantalum Removal Rate (nm/min) |
|---|---|---|---|---|---|
| 1.8 | 80 | 25 | 24 | 16 | 17 |
| 1.8 | 100 | 30 | 28 | 20 | 13 |
| 3.9 | 80 | 45 | 27 | 32 | 32 |
| 3.9 | 100 | 41 | 50 | 38 | 34 |
| 6.3 | 80 | 61 | 45 | 58 | 40 |
| 6.3 | 100 | 67 | 66 | 49 | 44 |
| K | | 8.1 | 6.6 | 7.9 | 5.9 |

Velocity has little effect within the narrow range of 80 to 100 RPM that was tested. The effect of pressure can be estimated by the Preston equation:

$$RR = KP_V + C.$$ Equation 1

Removal rate for a given metal is RR, $P_V$ is pressure at a constant velocity, C is RR at zero pressure, and K is the Preston constant which indicates the increase in RR with increasing pressure.

The Preston constant for copper removal rate with slurry of Example 2 is 1.2 times that of Example 3. The Preston constant for tantalum removal rate with slurry of Example 2 is 1.3 times that of Example 3.

This example demonstrates that a slurry composition from the method by which a silica powder is reduced by a single-pass operation through a double-jet cell provides distinct and superior performance when compared to a slurry composition from a conventional homogenization method.

Example 5

A silica was prepared using the aforementioned procedure in Example 1. Analysis of the resulting white powder showed the following properties: Nitrogen BET (5-point) 97 $m^2/g$; CTAB 99 $m^2/g$; 264 ml of dibutyl phthalate per 100 gm of anhydrous powder. From these data the average primary particle diameter is calculated to be 27 nanometers. The calculated surface roughness is 1.0.

A particle size reduction was conducted by using the process described in Example 1 with the exception that higher silica feed rate relative to the water feed rate was used. The resulting slurry was 22.22 weight percent solids. The aggregate particle size was characterized by laser light scattering as follows: average 0.216 microns; median 0.174 microns; and 10 volume percent greater than 0.420 microns.

Example 6

A silica was prepared using the produce described in Example 1. Analysis of the resulting white powder showed the following properties: Nitrogen BET (5-point) 89 $m^2/g$; CTAB 91 $m^2/g$; 244 ml of dibutyl phthalate per 100 gm of anhydrous powder, X-ray Fluorescence Chloride32 ppm, X-ray Fluorescence sulfate 0.095 weight percent as sodium sulfate, Loss on ignition (1150° C.) 6.07 weight percent, moisture (105° C.) 3.62 weight percent. From these CTAB data the average primary particle diameter is calculated to be 30 nanometers. From bound water determination of 2.39 weight percent, the hydroxyl content was calculated to be 18 hydroxyls per nanometer squared. The calculated surface roughness is 1.0.

Particle size reduction was conducted by using the aforementioned process described in Example 1. This slurry (813-973) was 6.67 weight percent solids, and the aggregate particle size was characterized by laser light scattering as follows: average 0.215 microns; median 0.175 microns; and 10 volume percent greater than 0.416 microns.

Example 7

An initial aqueous potassium silicate solution was prepared by heating water (110 gallons) and additive aqueous potassium silicate (1.6 gallons; 111.2 gm $K_2O$/liter). This stirred solution was neutralized to pH 8.5, and heated to 205° F. After 5 min, additive potassium silicate solution (41.9 gallons) and concentrated sulfuric acid (10.4 liters) were added simultaneously over a period of 45 minutes. The resulting slurry was allowed to stir at 205° F. for an additional 80 minutes at pH 8.5, then was acidified to pH 4.2. A portion of the product slurry was filtered, and water washed. The resulting filter cake was liquefied by high shear, and adjusted to pH 6.3. A portion of this slurry was spray dried to produce a white powder with a nominal average particle size by laser light scattering of 30 microns and 10 volume percent greater than 50 microns (813-1121, 2.95 percent moisture). Analysis of this powder showed the following properties: Nitrogen BET (5-point) 92 $m^2/g$; CTAB 93 $m^2/g$; 259 ml of dibutyl phthalate per 100 gm of anhydrous powder. From these data the average primary particle diameter is calculated to be 29 nanometers. The calculated surface roughness is 1.0.

Particle size reduction was conducted by using a double-jet cell that contained an elongated chamber of alumina reactors (6 reactors, 1 mm ID) and alternating UHMWPE seals (2.6 mm ID). Water was pressurized (45,000 psig) and passed through two nozzles (0.1 mm ID and 0.13 mm ID) to produce water jets that entered this elongated chamber from opposite directions. A portion of spray dried powder (813-1121) was introduced into this double-jet cell between the dominant water jet (from the 0.13 mm ID nozzle) and the elongated chamber. The slurry effluent was discharged at atmospheric pressure from this double-jet cell through an opening between the recessive water jet (from the 0.1 mm nozzle) and the elongated chamber. This slurry (813-1180, 15.3 kg) was 13.33 weight percent solids, and the aggregate particle size was characterized by laser light scattering as follows: average 0.164 microns; median 0.126 microns; and 10 volume percent greater than 0.331 microns.

A portion of the slurry (813-1180) was diluted with deionized water, and formulated for copper and tantalum polishing evaluation with a Struers DAP-V and an IC1400™ pad (Rodel). Metal removal rates were measured with varying polishing pressure, pad velocity, and abrasive concentrations and using formulation of 5 weight percent hydrogen peroxide at pH 4. The results were as follows:

TABLE 3

| Silica concentration Wt % | Pressure psig | Velocity RPM | Copper Removal Rate (nm/min) | Tantalum Removal Rate (nm/min) |
|---|---|---|---|---|
| 5.4 | 1.8 | 80 | 25 | 18 |
| 5.4 | 1.8 | 100 | 28 | 15 |
| 5.4 | 6.3 | 80 | 46 | 49 |
| 5.4 | 6.3 | 100 | 49 | 47 |
| 1.0 | 1.8 | 80 | 20 | 3 |
| 1.0 | 1.8 | 100 | 23 | 6 |
| 1.0 | 6.3 | 80 | 27 | 12 |
| 1.0 | 6.3 | 100 | 34 | 14 |

Another portion of spray dried powder (813-1121) was introduced into this double-jet cell between the dominant water jet (from the 0.13 mm ID nozzle) and the elongated chamber. The slurry effluent was discharged at atmospheric pressure from this double-jet cell through an opening between the recessive water jet (from the 0.1 mm nozzle) and the elongated chamber. This slurry (813-1192, 17.8 kg) was 12.29 weight percent solids, and the aggregate particle size was characterized by laser light scattering as follows: average 0.166 microns; median 0.126 microns; and 10 volume percent greater than 0.341 microns.

Another portion of spray dried powder (813-1121) was introduced into this double-jet cell between the dominant water jet (from the 0.13 mm ID nozzle) and the elongated chamber. The slurry effluent was discharged at atmospheric pressure from this double-jet cell through an opening between the recessive water jet (from the 0.1 mm nozzle) and the elongated chamber. This slurry (813-1235, 22.5 kg) was 16.41 weight percent solids, and the aggregate particle size was characterized by laser light scattering as follows: average 0.160 microns; median 0.127 microns; and 10 volume percent greater than 0.309 microns.

This slurry (813-1235) was filtered by pumping through the following filters in series: 75 micron/25 micron gradient cartridge, 25 micron/1 micron gradient cartridge, Millipore CM13 cartridge, and Millipore CMP 5 cartridge. An air-driven diaphragm pump was used to pump the slurry. The increase in pressure drop across the filters was negligible over the course of the filtration. The product slurry (813-1247, 9.90 kilograms) was 14.30 weight percent solids and the aggregate particle size was characterized by laser light scattering as follows: average 0.131 microns; median 0.118 microns; and 10 volume percent greater than 0.218 microns.

This slurry was then prepared for Flame Atomic Emission Spectroscopy by digesting the silica with hydrofluoric acid and sulfuric acid, followed by digestion with nitric acid and sulfuric acid. After evaporation to fumes of sulfuric acid, the dissolution was completed in hydrochloric acid. Samples were diluted to volume, shaken, and analyzed via Flame Emission Spectroscopy. Analysis of this slurry showed 0.062 weight percent potassium and 2.5 ppm sodium. This slurry (pH 6.9) was then pumped through a strong acid cation column for ion exchange. The column was 1 inch in diameter by 30 inches tall and contained approximately 19.75 inches of Bayer KPS macro reticulate ion exchange resin. The column had been regenerated with sulfuric acid (0.713 L @ 40 g/L). The slurry was fed at approximately 0.5 GPM/ft$^3$ bed volume, and the effluent product was collected. This slurry (813-1263, pH 2.4) was then prepared for Flame Atomic Emission Spectroscopy as previously described. Analysis of this slurry by Flame Emission Spectroscopy showed 0.039 weight percent potassium and 16 ppm sodium.

Examples of Silica with Low Surface Area and High Surface Roughness

Example 8

An initial aqueous potassium silicate solution was prepared by heating water (75 liters) was heated to 205° F., and additive aqueous potassium silicate (1.2 liters, 105.7 gm K$_2$O/liter) was added. This stirred solution was neutralized to pH 8.5. After 5 minutes, additive potassium silicate solution (31.7 liters) and concentrated sulfuric acid (1.92 liters) were added simultaneously over a period of 45 minutes. Aqueous potassium hydroxide (45 weight percent, 3000 g) was added. The resulting slurry was allowed to stir at 205° F. for an additional 80 minutes, then was acidified to pH 4.2. A portion of the product slurry was filtered, and water washed. The resulting filter cake (810-727) was liquefied by high shear, and adjusted to pH 6.3. A portion of this slurry was spray dried to produce a white powder with a nominal average particle size by laser light scattering of 30 microns and 10 volume percent greater than 50 microns (810-728, 6.04 percent moisture). Analysis of this powder showed the following properties: Nitrogen BET (5-point) 141 m$^2$/g; CTAB 72 m$^2$/g; 264 ml of dibutyl phthalate per 100 gm of anhydrous powder. From these data the average primary particle diameter is calculated to be 38 nanometers. The calculated surface roughness is 2.0.

Particle size reduction was conducted by using a double-jet cell that contained an elongated chamber of alumina reactors (6 reactors, 1 mm ID) and alternating UHMWPE seals (2.6 mm ID). Water was pressurized (45,000 psig) and passed through two nozzles (0.1 mm ID and 0.13 mm ID) to produce water jets that entered this elongated chamber from opposite directions. A portion of spray dried powder (810-728) was introduced into this double-jet cell between the dominant water jet (from the 0.13 mm ID nozzle) and the elongated chamber. The slurry effluent was discharged at atmospheric pressure from this double-jet cell through an opening between the recessive water jet (from the 0.1 mm nozzle) and the elongated chamber. This slurry (813-906) was 10.20 weight percent solids, and the aggregate particle size was characterized by laser light scattering as follows: average 0.210 microns; median 0.167 microns; and 10 volume percent greater than 0.415 microns.

A portion of the slurry (813-906) was diluted to 5.4 weight percent solids with deionized water, and formulated for copper and tantalum polishing evaluation with a Struers DAP-V and a SUBA 500™ pad (Rodel). The formulations and metal removal rates are as follows:

TABLE 4

| Formulation | pH | Copper Removal Rate (nm/min) | Tantalum Removal Rate (nm/min) | Copper: Tantalum Selectivity |
|---|---|---|---|---|
| Water only | 4.9 | 3 | 55 | 0.1 |
| 5% wt. Hydrogen peroxide | 4.7 | 78 | 39 | 2.0 |
| 5% wt. Hydrogen peroxide 1% wt. Glycine | 5.3 | 714 | 8 | 89.3 |
| 0.005 M Ferric Nitrate | 2.4 | 144 | 51 | 2.8 |

Example 9

A particle size reduction of a portion of the previous example batch of silica (Example 8) was conducted by using a conventional homogenizer. A portion of the filter cake was liquefied with high shear and diluted with water to 10 percent solids at pH 4. The particle size for this slurry (813-921) was characterized by laser light scattering as follows: average 26.58 microns; median 22.87 microns; and 10 volume percent greater than 48.76 microns. The volume percent of particles greater than 1.05 microns was 100. This slurry (813-921) was pressurized and passed through an APV LAB 1000 Gaulin-type homogenizer that was fitted with a tungsten-carbide valve and seat with the gap adjusted to provide about 12,600 psig of back-pressure. The particle size for this product slurry (813-922), was characterized by laser light scattering as follows: average 0.441 microns; median 0.201 microns; and 10 volume percent greater than 0.686 microns. The volume percent of particles greater than 1.05 microns was 9.6.

A second pass through a conventional homogenizer was required to reduce all the particles to less than 1 micron. The single-pass slurry (813-922) was pressurized and passed through an APV LAB 1000 Gaulin-type homogenizer that was fitted with a tungsten-carbide valve and seat with the gap adjusted to provide about 13,000 psig of back-pressure. This product slurry (813-925) was 10.21 weight percent solids, and the aggregate particle size was characterized by laser light scattering as follows: average 0.229 microns; median 0.180 microns; and 10 volume percent greater than 0.455 microns. The volume percent of particles greater than 1.05 microns was 0.0.

Comparative Example 10

A comparison was made using silica slurries of Examples 8 and 9 which represent two particle-size reduction methods (average particle sizes 0.210 microns and 0.229 microns respectively). Formulations of 5 weight percent $H_2O_2$ with 5.4 weight percent silica at a pH of 4. The results are shown in Table 5 below.

TABLE 5

| Pressure Psig | Velocity RPM | Example 8 Copper Removal Rate (nm/min) | Example 9 Copper Removal Rate (nm/min) | Example 8 Tantalum Removal Rate (nm/min) | Example 9 Tantalum Removal Rate (nm/min) |
|---|---|---|---|---|---|
| 1.8 | 80 | 42 | 30 | 14 | 12 |
| 1.8 | 100 | 42 | 35 | 19 | 12 |
| 3.9 | 80 | 68 | 43 | 40 | 29 |
| 3.9 | 100 | 60 | 47 | 40 | 26 |
| 6.3 | 80 | 95 | 56 | 58 | 30 |
| 6.3 | 100 | 92 | 62 | 50 | 39 |
| K |  | 11.5 | 5.9 | 8.3 | 5.0 |

Velocity has little effect within the narrow range of 80 to 100 RPM that was tested. The effect of pressure can be estimated by the Preston equation, Equation 1. The Preston constant, K, indicates the increase in RR with increasing pressure. The Preston constant for copper removal rate with Example 8 is 1.9 times that of Example 9. The Preston constant for tantalum removal rate with Example 8 is 1.7 times that of Example 9.

This example demonstrates that a slurry composition from the method by which a silica powder is reduced by a single-pass operation through a double-jet cell provides distinct and superior performance when compared to a slurry composition from a conventional homogenization method.

Example 11

A second batch of silica was prepared using the aforementioned procedure in Example 8 with the exception that the amounts of the following reactants were varied. An initial aqueous potassium silicate solution was with additive aqueous potassium silicate (1.2 liters, 110.5 gm $K_2$O/liter) was added. This stirred solution was neutralized to pH 8.5. After 5 minutes, additive potassium silicate solution (31.7 liters) and concentrated sulfuric acid (2.03 liters) were added simultaneously over a period of 45 minutes. Analysis of spray-dried powder product showed the following properties: 6.01 weight percent moisture, Nitrogen BET (5-point) 140 $m^2$/g; CTAB 83 $m^2$/g; 270 ml of dibutyl phthalate per 100 gm of anhydrous powder. From these data the average primary particle diameter is calculated to be 33 Manometers. From bound water determination, the hydroxyl content was calculated to be 29 hydroxyls per nanometer squared. The calculated surface roughness is 1.7.

Particle size reduction was conducted by using a double-jet cell that contained an elongated chamber of alumina reactors (6 reactors, 1 mm ID) and alternating UHMWPE seals (2.6 mm ID). Water was pressurized (45,000 psig) and passed through two nozzles (0.1 mm ID and 0.13 mm ID) to produce water jets that entered this elongated chamber from opposite directions. A portion of spray dried powder (810-854) was introduced into this double-jet cell between the dominant water jet (from the 0.13 mm ID nozzle) and the elongated chamber. The slurry effluent was discharged at atmospheric pressure from this double-jet cell through an opening between the recessive water jet (from the 0.1 mm nozzle) and the elongated chamber. This slurry (813-1081) was 12.00 weight percent solids, and the aggregate particle size was characterized by laser light scattering as follows: average 0.209 microns; median 0.169 microns; and 10 volume percent greater than 0.407 microns.

Examples for Silica with High Surface Area and Low Surface Roughness

Example 12

An initial aqueous potassium silicate solution was prepared by heating water (75 liters) was heated to 167° F., and additive aqueous potassium silicate (2.39 liters, 113 gm $K_2$O/liter) was added. After 5 minutes, additive potassium silicate solution (31.5 liters) and concentrated sulfuric acid (1.96 liters) were added simultaneously over a period of 90 minutes. The resulting slurry was allowed to stir at 205° F. for an additional 30 minutes, then was acidified to pH 4.2. A portion of the product slurry was filtered, and water washed. The resulting filter cake was liquefied by high shear, adjusted to pH 6.3, and a portion of this slurry was spray dried to produce a white powder (810-881, 4.06 percent moisture). Analysis of this powder showed the following properties: Nitrogen BET (5-point) 166 $m^2$/g; CTAB 156 $m^2$/g; 293 ml of dibutyl phthalate per 100 gm of anhydrous powder. From these data the average primary particle diameter is calculated to be 17 nanometers. From bound water determination, the hydroxyl content was calculated to be 12 hydroxyls per nanometer squared. The calculated surface roughness is 1.1.

Particle size reduction was conducted by using a double-jet cell that contained an elongated chamber of alumina reactors (6 reactors, 1 mm ID) and alternating UHMWPE seals (2.6 mm ID). Water was pressurized (45,000 psig) and passed through two nozzles (0.1 mm ID and 0.13 mm ID) to produce water jets that entered this elongated chamber from opposite directions. A portion of spray dried powder (810-881) was introduced into this double-jet cell between the dominant water jet (from the 0.13 mm ID nozzle) and the elongated chamber. The slurry effluent was discharged at atmospheric pressure from this double-jet cell through an opening between the recessive water jet (from the 0.1 mm nozzle) and the elongated chamber. This slurry (813-1106) was 8.59 weight percent solids, and the aggregate particle size was characterized by laser light scattering as follows: average 0.207 microns; median 0.165 microns; and 10 volume percent greater than 0.406 microns.

Example 13

A silica was prepared using the aforementioned procedure in Example 12. Analysis of the spray dried powder product showed the following properties: 4.92 weight percent moisture Nitrogen BET (5-point) 158 $m^2/g$; CTAB 152 $m^2/g$; 299 ml of dibutyl phthalate per 100 gm of anhydrous powder. From these data the average primary particle diameter is calculated to be 18 nanometers. The calculated surface roughness is 1.0.

Particle size reduction was conducted by using a double-jet cell that contained an elongated chamber of alumina reactors (6 reactors, 1 mm ID) and alternating UHMWPE seals (2.6 mm ID). Water was pressurized (45,000 psig) and passed through two nozzles (0.1 mm ID and 0.13 mm ID) to produce water jets that entered this elongated chamber from opposite directions. A portion of spray dried powder (810-903) was introduced into this double-jet cell between the dominant water jet (from the 0.13 mm ID nozzle) and the elongated chamber. The slurry effluent was discharged at atmospheric pressure from this double-jet cell through an opening between the recessive water jet (from the 0.1 mm nozzle) and the elongated chamber. This slurry (813-1186) was 12.86 weight percent solids, and the aggregate particle size was characterized by laser light scattering as follows: average 0.207 microns; median 0.166 microns; and 10 volume percent greater than 0.406 microns.

A portion of the slurry (813-1186) was diluted with deionized water, and formulated for copper and tantalum polishing evaluation with a Struers DAP-V and an IC1400™ pad (Rodel). Metal removal rates were measured with varying polishing pressure, pad velocity, and abrasive concentrations and using formulation of 5 weight percent hydrogen peroxide at pH 4. The results were as follows:

TABLE 6

| Silica concentration Wt % | Pressure psig | Velocity RPM | Copper Removal Rate (nm/min) | Tantalum Removal Rate (nm/min) |
|---|---|---|---|---|
| 3.0 | 1.8 | 80 | 18 | 9 |
| 3.0 | 1.8 | 100 | 24 | 8 |
| 3.0 | 6.3 | 80 | 25 | 28 |
| 3.0 | 6.3 | 100 | 31 | 24 |
| 6.0 | 1.8 | 80 | 25 | 16 |
| 6.0 | 1.8 | 100 | 26 | 16 |
| 6.0 | 6.3 | 80 | 41 | 40 |
| 6.0 | 6.3 | 100 | 41 | 42 |

Example for Fumed Silica with Low Surface Area and Low Surface Roughness

Example 14

A commercially available sample of fumed silica Cabot L90 was obtained. Analysis of this powder (813-1179; 0.66 weight percent moisture) showed the following properties: Nitrogen BET (5-point) 93 $m^2/g$; CTAB 100 $m^2/g$; and particle size characterized by laser light scattering as follows: average 0.188 microns; median 0.145 microns; and 10 volume percent greater than 0.382 microns. From these data the average primary particle diameter is calculated to be 27 nanometers. The calculated surface roughness is 0.9.

Particle size reduction was conducted by using a double-jet cell that contained an elongated chamber of alumina reactors (6 reactors, 1 mm ID) and alternating UHMWPE seals (2.6 mm ID). Water was pressurized (45,000 psig) and passed through two nozzles (0.1 mm ID and 0.13 mm ID) to produce water jets that entered this elongated chamber from opposite directions. A portion of powder (813-1179) was introduced into this double-jet cell between the dominant water jet (from the 0.13 mm ID nozzle) and the elongated chamber. The slurry effluent was discharged at atmospheric pressure from this double-jet cell through an opening between the recessive water jet (from the 0.1 mm nozzle) and the elongated chamber. This slurry (813-1188) was 11.56 weight percent solids, and the aggregate particle size was characterized by laser light scattering as follows: average 0.111 microns; median 0.099 microns; and 10 volume percent greater than 0.178 microns.

A portion of the slurry (813-1188) was diluted with deionized water, and formulated for copper and tantalum polishing evaluation with a Struers DAP-V and an IC1400™ pad (Rodel). Metal removal rates were measured with varying polishing pressure, pad velocity, and abrasive concentrations and using formulation of 5 weight percent hydrogen peroxide at pH 4. The results were as follows:

TABLE 7

| Silica concentration Wt % | Pressure psig | Velocity RPM | Copper Removal Rate (nm/min) | Tantalum Removal Rate (nm/min) |
|---|---|---|---|---|
| 5.4 | 1.8 | 80 | 41 | 8 |
| 5.4 | 1.8 | 100 | 54 | 11 |
| 5.4 | 6.3 | 80 | 66 | 20 |
| 5.4 | 6.3 | 100 | 82 | 25 |
| 1.0 | 1.8 | 80 | 32 | 3 |
| 1.0 | 1.8 | 100 | 40 | 4 |
| 1.0 | 6.3 | 80 | 48 | 10 |
| 1.0 | 6.3 | 100 | 60 | 14 |

Examples for Fumed Silica with High Surface Area and Low Surface Roughness

Example 15

A commercially available sample of fumed silica Aerosil 130 was obtained. Analysis of this powder (813-1003; 1.25 weight percent moisture) showed the following properties: Nitrogen BET (5-point) 137 $m^2/g$; CTAB 142 $m^2/g$; 218 ml of dibutyl phthalate per 100 gm of anhydrous powder. The aggregate particle size was characterized by laser light scattering as follows: average 31.06 microns; median 23.99 microns; and 10 volume percent greater than 62.47 microns.

From these data the average primary particle diameter is calculated to be 19 nanometers. The calculated surface roughness is 1.0.

Particle size reduction was conducted by using a double-jet cell that contained an elongated chamber of alumina reactors (6 reactors, 1 mm ID) and alternating UHMWPE seals (2.6 mm ID). Water was pressurized (45,000 psig) and passed through two nozzles (0.1 mm ID and 0.13 mm ID) to produce water jets that entered this elongated chamber from opposite directions. A portion of powder (813-1003) was introduced into this double-jet cell between the dominant water jet (from the 0.13 mm ID nozzle) and the elongated chamber. The slurry effluent was discharged at atmospheric pressure from this double-jet cell through an opening between the recessive water jet (from the 0.1 mm nozzle) and the elongated chamber. This slurry (813-1190) was 9.86 weight percent solids, and the aggregate particle size was characterized by laser light scattering as follows: average 0.106 microns; median 0.096 microns; and 10 volume percent greater than 0.169 microns.

A portion of the slurry (813-1190) was diluted with deionized water, and formulated for copper and tantalum polishing evaluation with a Struers DAP-V and an IC1400™ pad (Rodel). Metal removal rates were measured with varying polishing pressure, pad velocity, and abrasive concentrations and using formulation of 5 weight percent hydrogen peroxide at pH 4. The results were as follows:

TABLE 8

| Silica concentration Wt % | Pressure psig | Velocity RPM | Copper Removal Rate (nm/min) | Tantalum Removal Rate (nm/min) |
| --- | --- | --- | --- | --- |
| 3.0 | 1.8 | 80  | 25 | 8  |
| 3.0 | 1.8 | 100 | 28 | 9  |
| 3.0 | 6.3 | 80  | 36 | 38 |
| 3.0 | 6.3 | 100 | 39 | 33 |
| 6.0 | 1.8 | 80  | 28 | 12 |
| 6.0 | 1.8 | 100 | 32 | 21 |
| 6.0 | 6.3 | 80  | 42 | 41 |
| 6.0 | 6.3 | 100 | 54 | 56 |

Comparative Example 16

These comparative examples show the difference between silica of the present invention and that prepared from fumed silica with a similar aggregate and primary particle sizes. Data from Tables 5 and 6 were used to represent high and low surface area of silica of the present invention. Data from Tables 7 and 8 were used to represent high and low surface area of fumed silica.

A linear model was used to describe the polishing data obtained with the 5 weight percent hydrogen peroxide formulations at pH 4. A linear regression analysis was performed to solve the for the equation:

$$MRR = KP_V + m[SiO2] + nP_V[SiO2] + rS + B.$$  Equation 2

Where terms are defined as, $P_V$ is pressure at constant velocity

[SiO2] is weight percent silica abrasive

S is CTAB specific surface area of the silica abrasive

B is a constant

Velocity had little effect within the narrow range that was employed to obtain these data. Both copper and tantalum removal rates were compared.

In order to make a direct comparison between fumed silica and the current invention, the parameters were compared to orthogonal coded variables, as is accordance with standard statistical methods. This method allows the leverage of each parameter to be compared without the bias of the size of its natural range. Consequently, the leverage of surface area and concentration, for instance, can be compared despite surface area varying over about 50 units, and concentration over only 5 units. The orthogonal coded terms were as follows:

TABLE 9

| Parameter Estimate for Copper Removal Rate (nm/min) | Silica of the Present Invention [Example 8 and 13] | Fumed Silica [Examples 14 and 15] |
| --- | --- | --- |
| K | 6.5  | 9.3   |
| M | 4.1  | 2.9   |
| N | 2.2  | 1.2   |
| R | −2.0 | −10.3 |

These parameters show that copper removal rate declines as surface area increases, but the decline is sharper with fumed silica. Increasing silica concentration more strongly impacts copper removal rate for precipitated silica. Increasing pressure raises copper removal rate more sharply for fumed silica.

TABLE 10

| Parameter Estimate for Tantalum Removal Rate (nm/min) | Silica of the Present Invention [Example 8 and 13] | Fumed Silica [Examples 14 and 15] |
| --- | --- | --- |
| K | 10.4 | 10.1 |
| M | 9.0  | 6.8  |
| N | 4.1  | 2.6  |
| R | −1.9 | 5.6  |

These parameters show that tantalum removal rate declines as surface area increases for precipitated silica, but the rises with fumed silica. Increasing silica concentration more strongly impacts tantalum removal rate for precipitated silica. Increasing pressure raises tantalum removal rate more similarly for both silica types.

This model may be used to estimate predicted removal rates that may further serve to demonstrate the differences between these examples. A model slurry which may be used for this estimate is comprised of 5 weight percent hydrogen peroxide at pH 4 with 4 weight percent silica with surface area of 90 m²/g and polishing pressure of 6 psig and velocity around 90 RPM. The predicted removal rates were as follows:

TABLE 11

|  | Copper Removal Rate (nm/min) | Tantalum Removal Rate (nm/min) | Tantalum:Copper selectivity |
| --- | --- | --- | --- |
| Silica of the Present Invention | 52 | 55 | 1.1 |
| Fumed Silica | 77 | 27 | 0.3 |

This model predicts that low surface precipitated silica will produce higher removal rates for tantalum over copper, and thereby should produce less dishing in the barrier removal CMP step on copper interconnects that use a tantalum barrier. At higher silica surface area, tantalum:copper selectivity changes little for precipitated silica, and remains less than one for fumed silica.

Examples for Silica with High Surface Area and High Surface Roughness

Example 17

An initial aqueous potassium silicate solution was prepared by heating water (74 liters) was heated to 176° F., and additive aqueous potassium silicate (2.4 liters, 111.2 gm $K_2O$/liter) was added. Aqueous potassium hydroxide (45 weight percent, 1.4 kg) was added to this hot silicate solution. After 5 minutes, additive potassium silicate solution (31.5 liters) and concentrated sulfuric acid (2 liters) were added simultaneously over a period of 90 minutes. The slurry pH was adjusted to 8.5. The resulting slurry was allowed to stir at 176° F. for an additional 30 minutes, then was acidified to pH 4.2. A portion of the product slurry was filtered, and water washed. The resulting filter cake was liquefied by high shear, adjusted to pH 6.3, and a portion of this slurry was spray dried to produce a white powder (810-980, 6.7 percent moisture). Analysis of this powder showed the following properties: Nitrogen BET (5-point) 237 $m^2$/g; CTAB 107 $m^2$/g; 267 ml of dibutyl phthalate per 100 gm of anhydrous powder. From these data the average primary particle diameter is calculated to be 25 nanometers. The calculated surface roughness is 2.2.

Particle size reduction was conducted by using a double-jet cell that contained an elongated chamber of alumina reactors (6 reactors, 1 mm ID) and alternating UHMWPE seals (2.6 mm ID). Water was pressurized (45,000 psig) and passed through two nozzles (0.1 mm ID and 0.13 mm ID) to produce water jets that entered this elongated chamber from opposite directions. A portion of spray dried powder (810-980) was introduced into this double-jet cell between the dominant water jet (from the 0.13 mm ID nozzle) and the elongated chamber. The slurry effluent was discharged at atmospheric pressure from this double-jet cell through an opening between the recessive water jet (from the 0.1 mm nozzle) and the elongated chamber. This slurry (813-1237) was 14.33 weight percent solids, and the aggregate particle size was characterized by laser light scattering as follows: average 0.206 microns; median 0.166 microns; and 10 volume percent greater than 0.401 microns.

Example 18

An initial aqueous potassium silicate solution was prepared by heating water (74.5 liters) was heated to 176° F., and additive aqueous potassium silicate (2.4 liters, 111.2 gm $K_2O$/liter) was added. Aqueous potassium hydroxide (45 weight percent, 0.7 kg) was added to this hot silicate solution. After 5 minutes, additive potassium silicate solution (31.5 liters) and concentrated sulfuric acid (2 liters) were added simultaneously over a period of 90 minutes. The slurry pH was adjusted to 8.5. The resulting slurry was allowed to stir at 176° F. for an additional 30 minutes, then was acidified to pH 4.2. A portion of the product slurry was filtered, and water washed. The resulting filter cake was liquefied by high shear, adjusted to pH 6.3, and a portion of this slurry was spray dried to produce a white powder (6.92 percent moisture). Analysis of this powder showed the following properties: Nitrogen BET (5-point) 218 $m^2$/g; CTAB 134 $m^2$/g; 283 ml of dibutyl phthalate per 100 gm of anhydrous powder. From these data the average primary particle diameter is calculated to be 20 nanometers. The calculated surface roughness is 1.6.

Particle size reduction was conducted by using a double-jet cell that contained an elongated chamber of alumina reactors (6 reactors, 1 mm ID) and alternating UHMWPE seals (2.6 mm ID). Water was pressurized (45,000 psig) and passed through two nozzles (0.1 mm ID and 0.13 mm ID) to produce water jets that entered this elongated chamber from opposite directions. A portion of spray dried powder (810-985) was introduced into this double-jet cell between the dominant water jet (from the 0.13 mm ID nozzle) and the elongated chamber. The slurry effluent was discharged at atmospheric pressure from this double-jet cell through an opening between the recessive water jet (from the 0.1 mm nozzle) and the elongated chamber. This slurry was (813-1238) 11.02 weight percent solids, and the aggregate particle size was characterized by laser light scattering as follows: average 0.158 microns; median 0.132 microns; and 10 volume percent greater than 0.275 microns.

Example 19

An initial aqueous potassium silicate solution was prepared by heating water (80.5 liters) was heated to 176° F., and additive aqueous potassium silicate (4.8 liters, 111.2 gm $K_2O$/liter) was added. After 5 minutes, additive potassium silicate solution (31.5 liters) and concentrated sulfuric acid (2 liters) were added simultaneously over a period of 90 minutes. The slurry pH was adjusted to 8.5. The resulting slurry was allowed to stir at 176° F. for an additional 30 minutes, then was acidified to pH 4.2. A portion of the product slurry was filtered, and water washed. The resulting filter cake was liquefied by high shear, adjusted to pH 6.3, and a portion of this slurry was spray dried to produce a white powder (810-987), 7.03 percent moisture). Analysis of this powder showed the following properties: Nitrogen BET (5-point) 217 $m^2$/g; CTAB 147 $m^2$/g; 285 ml of dibutyl phthalate per 100 gm of anhydrous powder. From these data the average primary particle diameter is calculated to be 18.5 nanometers. The calculated surface roughness is 1.5.

Particle size reduction was conducted by using a double-jet cell that contained an elongated chamber of alumina reactors (6 reactors, 1 mm ID) and alternating UHMWPE seals (2.6 mm ID). Water was pressurized (45,000 psig) and passed through two nozzles (0.1 mm ID and 0.13 mm ID) to produce water jets that entered this elongated chamber from opposite directions. A portion of spray dried powder (810-987) was introduced into this double-jet cell between the dominant water jet (from the 0.13 mm ID nozzle) and the elongated chamber. The slurry effluent was discharged at atmospheric pressure from this double-jet cell through an opening between the recessive water jet (from the 0.1 mm nozzle) and the elongated chamber. This slurry (813-1239) was 10.02 weight percent solids, and the aggregate particle size was characterized by laser light scattering as follows: average 0.125 microns; median 0.111 microns; and 10 volume percent greater than 0.213 microns.

Example 20

An initial aqueous potassium silicate solution was prepared by heating water (86 liters) was heated to 176° F., and additive aqueous potassium silicate (7.2 liters, 111.2 gm $K_2O$/liter) was added. After 5 minutes, additive potassium silicate solution (31.5 liters) and concentrated sulfuric acid (2 liters) were added simultaneously over a period of 90 minutes. The slurry pH was adjusted to 8.5. The resulting slurry was allowed to stir at 176° F. for an additional 30 minutes, then was acidified to pH 4.2. A portion of the product slurry was filtered, and water washed. The resulting filter cake was liquefied by high shear, adjusted to pH 6.3, and a portion of this slurry was spray dried to produce a white powder (810-989), 7.35 percent moisture). Analysis of this powder showed the following properties: Nitrogen BET (5-point) 244 m$^2$/g; CTAB 129 m$^2$/g; 292 ml of dibutyl phthalate per 100 gm of anhydrous powder. From these data the average primary particle diameter is calculated to be 21 nanometers. The calculated surface roughness is 1.9.

Particle size reduction was conducted by using a double-jet cell that contained an elongated chamber of alumina reactors (6 reactors, 1 mm ID) and alternating UHMWPE seals (2.6 mm ID). Water was pressurized (45,000 psig) and passed through two nozzles (0.1 mm ID and 0.13 mm ID) to produce water jets that entered this elongated chamber from opposite directions. A portion of spray dried powder (810-989) was introduced into this double-jet cell between the dominant water jet (from the 0.13 mm ID nozzle) and the elongated chamber. The slurry effluent was discharged at atmospheric pressure from this double-jet cell through an opening between the recessive water jet (from the 0.1 mm nozzle) and the elongated chamber. This slurry (813-1240) was 11.96 weight percent solids, and the aggregate particle size was characterized by laser light scattering as follows: average 0.137 microns; median 0.115 microns; and 10 volume percent greater than 0.232 microns.

Comparative Examples for Silica Slurry Feed through Single Alumina Orifice

These examples demonstrate that the slurry composition from the method by which silica slurry is fed through an alumina orifice at varying pressures provides a slurry having a particle size distribution characteristic of CMP slurries—i.e. having a completely sub-micron particle size distribution. However, the abrasive slurry quickly wears the alumina nozzle sufficiently such that suitable process intensity cannot be maintained for more than a few small samples Example 21

A filter cake (813-368) of a silica of the present invention was liquefied under low shear with water to approximately 12 weight percent to provide silica slurry (813-442) with a pH of approximately 6.3. A portion of this silica slurry when spray dried produced a white powder (813-369). Analysis of this powder showed the following properties: Nitrogen BET (5 point) 158 m$^2$/g; CTAB 152 m$^2$/g. From these data the average primary particle diameter is calculated to be 18 nanometers. The calculated surface roughness is 1.0.

Another portion of this liquefied filiter cake (813-442), having an average particle size of 25.83 microns and a median particle size of 24.180 microns, with 10 volume percent greater then 45.09 microns, was fed through a 0.1 mm I.D. alumina nozzle at different pressure drops across the nozzle. After passing through the nozzle orifice, the fluid then passed into an elongated chamber containing reactors and seals, namely 11 alumina reactors with an internal diameter of 1.0 mm with alternating UHMWPE seals having an internal diameter of 2.6 mm, to the end of the interaction chamber where the stream then reversed and flowed back through the interaction chamber, against the path of the original jet. The outlet port of the interaction chamber was directed to a stainless steel coil immersed in a bath of ice and water, and the product slurry was collected in an open container.

At a pressure drop across the orifice of 15,000 psig, the slurry effluent comprising of approximately 150 ml (813-445) had an average particle size of 0.239 microns and a median particle size of 0.206 microns with 10 volume-percent greater than 0.446 microns.

At a pressure drop across the orifice of 30,000 psig, the slurry effluent comprising approximately 150 ml (813-446) had an average particle size of 0.197 microns and a median particle size of 0.155 microns with 10 volume percent greater than 0.386 microns.

At a pressure drop across the orifice of 45,000 psig, the slurry effluent comprising approximately 150 ml (813-447) had an average particle size of 0.181 microns and a median particle size of 0.137 microns with 10 volume percent greater than 0.364 microns.

When processing water through the machine following the above experimental runs, the machine was no longer capable of maintaining a 45,000 psig pressure drop across the nozzle, and the nozzle was replaced.

Example 22

A liquefied filter cake of silica of the present invention (813-442) was pH adjusted from 6.28 to 9.99 with concentrated ammonium hydroxide (29.6 weight percent Assay) to provide silica slurry, this slurry having the same particle size distribution as (813-442). At a pressure drop of 45,000 psig, the resulting slurry effluent comprising of approximately 150 ml (813-450) had an average particle size of 0.156 microns and a median particle size of 0.124 microns with 10 volume percent greater than 0.303 microns.

Liquefied filter cake of silica of the current invention (813-442) was pH adjusted from 6.37 to 10.14 with concentrated sodium hydroxide (50% w/w) to provide silica slurry (813-444), this slurry having the same particle size distribution as (813-442). At a pressure drop of 25,000 psig, the resulting slurry effluent comprising of approximately 150 ml (813-451) had an average particle size of 0.179 microns and a median particle size of 0.136 microns with 10 volume percent greater than 0.306 micron.

The nozzle through which this slurry was passed was sufficiently worn such that the maximum obtainable pressure drop across the nozzle on a sample of similar characteristics was 25,000 psig.

Comparative Example of Silica Slurry Feed Into Single Water Jet

This examples demonstrate that the slurry composition from the method by which silica slurry is fed into a single water jet after the jet has been created, thereby eliminating wear on the alumina nozzle such that a suitable process intensity can be maintained. The slurry is then subjected to the subsequent reactor configuration described, and this process provides an effluent slurry having a particle size distribution characteristic of CMP slurries—i.e.—having a completely sub-micron particle size distribution at the higher operating pressure.

Example 23

Slurry of silica the present invention (813-442) having an average particle size of 25.83 microns and a median particle size of 24.180 microns, with 10 volume percent greater then 45.09 microns was introduced on the low-pressure side of the alumina nozzle, not passing through the alumina nozzle, rather to an area of vacuum created by the water jet. The water jet, created at different pressure drops across the nozzle, was formed by a configuration comprising one nozzle of 0.1 mm I.D, configured to deliver a jet of water along a path into an elongated chamber containing reactors and seals, namely 11 alumina reactors with an internal diameter of 1.0 mm with alternating UHMWPE seals having an internal diameter of 2.6 mm, to the end of the interaction chamber where the stream was then reversed, flowing back through the interaction chamber, against the path of the original jet. The outlet port of the interaction chamber was directed to an open container in which the product slurry was collected.

A portion of the original silica slurry (813-442) was introduced into this single-jet cell between the water jet (from the 0.13 mm ID nozzle) and the elongated chamber, the water jet formed at a pressure drop of 20,000 psig. The resulting slurry effluent (813-448) had an average particle size of 0.723 microns and a median particle size of 0.230 microns with 10 volume percent greater than 1.913. The nozzle through which the water was passed showed no sign of degradation.

Another portion of the original silica slurry (813-442) was introduced into this single-jet cell between the water jet (from the 0.13 mm ID nozzle) and the elongated chamber, the water jet formed at a pressure drop of 40,000 psig. The resulting slurry effluent (813-449) had an average particle size of 0.211 microns and a median particle size of 0.156 microns with 10 volume percent greater than 0.432 microns. The nozzle through which the water was passed showed no sign of degradation.

Dual Jet, Dual Feed: Powder Feed Into Water Jets With Various Reactor Configurations These examples demonstrate that the slurry composition from the method by which silica powder is fed to a dual-water jet configuration having the specifications of alumina reactors (1 reactor, 1 mm I.D.) and alternating UHMWPE seals (2.6 mm I.D.), does not provide an effluent slurry having a completely sub-micron particle size distribution, regardless of the operating pressure. They also demonstrate that the slurry composition from the method by which silica powder is fed to a dual-water jet configuration having the specifications of alumina reactors (5 reactors, 1 mm I.D. followed by 1 reactor, 0.5 mm I.D.) and alternating UHMWPE seals (2.6 mm I.D), does not provide an effluent slurry having a completely sub-micron particle size distribution when operating at 45,000 psig. They also demonstrate that the slurry composition from the method by which silica powder is fed to a dual-water jet configuration having the specifications of alumina reactors (6 reactors, 1 mm I.D.) and alternating UHMWPE seals (2.6 mm I.D.) does provide an effluent slurry having a completely sub-micron particle size distribution when operating at 45,000 psig.

Example 24

Filter Cake (813-368) of silica of the present invention was liquefied under low shear with water to approximately 12 weight percent, and pH adjusted to approximately 6.3. A portion of this silica slurry when spray dried produced a white powder. Analysis of this powder (813-369) showed the following properties: Nitrogen BET (5 point) 158 $m^2/g$; CTAB 152 $m^2/g$. The calculated surface roughness is 1.0.

This spray-dried powder (813-369) was characterized as having an average particle size of 28.89 microns and a median particle size of 31.170 microns. Particle size reduction of a portion of this powder was conducted by using a double-jet cell that contained an elongated chamber of alumina reactors (1 reactors, 1 mm I.D.) and alternating UHMWPE seals (2.6 mm I.D.). Water was pressurized (30,000 psig) and passed through two nozzles (0.1 mm I.D. and 0.13 mm I.D.) to produce water jets that entered this elongated chamber from opposite directions. A portion of silica powder (813-369) was introduced into this double-jet cell between the dominant water jet (from the 0.13 mm ID nozzle) and the elongated chamber. The slurry effluent was discharged at atmospheric pressure from this double-jet cell through an opening between the recessive water jet (from the 0.1 mm nozzle) and the elongated chamber. This slurry (813-474) was 20.2 weight percent solids, and the aggregate particle size was characterized by laser light scattering as follows: average 16.51 microns; median 12.97 microns; and 10 volume percent greater than 40.19 microns.

Example 25

Particle size reduction of another portion of this powder was conducted by using a double-jet cell that contained an elongated chamber of alumina reactors (1 reactors, 1 mm I.D.) and alternating UHMWPE seals (2.6 mm I.D.). Water was pressurized (45,000 psig) and passed through two nozzles (0.1 mm I.D. and 0.13 mm I.D.) to produce water jets that entered this elongated chamber from opposite directions. A portion of silica slurry (813-369) was introduced into this double-jet cell between the dominant water jet (from the 0.13 mm ID nozzle) and the elongated chamber. The slurry effluent was discharged at atmospheric pressure from this double-jet cell through an opening between the recessive water jet (from the 0.1 mm nozzle) and the elongated chamber. This slurry (813-473) was 14.9 weight percent solids, and the aggregate particle size was characterized by laser light scattering as follows: average 12.54 microns; median 7.313 microns; and 10 volume percent greater than 34.61 microns.

Example 26

Particle size reduction of another portion of this powder was conducted by using a double-jet cell that contained an elongated chamber of alumina reactors (6 reactors, 1 mm I.D.) and alternating UHMWPE seals (2.6 mm I.D.). Water was pressurized (45,000 psig) and passed through two nozzles (0.1 mm I.D. and 0.13 mm I.D.) to produce water jets that entered this elongated chamber from opposite directions. A portion of silica powder (813-369) was introduced into this double-jet cell between the dominant water jet (from the 0.13 mm ID nozzle) and the elongated chamber. The slurry effluent was discharged at atmospheric pressure from this double-jet cell through an opening between the recessive water jet (from the 0.1 mm nozzle) and the elongated chamber. This slurry (813-477) was 7.4 weight percent solids, and the aggregate particle size was characterized by laser light scattering as follows: average 0.148 microns; median 0.121 microns; and 10 volume percent greater than 0.280 microns.

Example 27

A spray dried silica powder of the current invention was prepared, analysis of this powder (810-541) showed the following properties: Nitrogen BET (5 point) 169 $m^2/g$; CTAB 166 $m^2/g$. The calculated surface roughness is 1.0.

Particle size reduction of a portion of this powder was conducted by using a double-jet cell that contained an elongated chamber of alumina reactors (alternating 1 mm ID alumina reactors and 0.5 mm ID alumina reactors each separated with an UHMWPE seal (2.6 mm I.D.). Water was pressurized (45,000 psig) and passed through two nozzles (0.1 mm I.D. and 0.13 mm I.D.) to produce water jets that entered this elongated chamber from opposite directions. Silica powder (810-541) was introduced into this double-jet cell between the dominant water jet (from the 0.13 mm ID nozzle) and the elongated chamber. The slurry effluent was discharged at atmospheric pressure from this double-jet cell through an opening between the recessive water jet (from the 0.1 mm nozzle) and the elongated chamber. This slurry (813-497) was 6.4 weight percent solids, and the aggregate particle size was characterized by laser light scattering as follows: average 0.827 microns; median 0.245 microns; and 10 volume percent greater than 2.867 microns.

Example 28

Particle size reduction of another portion of this powder was conducted by using a double-jet cell that contained an elongated chamber of alumina reactors (5 reactors, 1 mm I.D. followed by 1 reactor, 0.5 mm I.D.) and alternating UHMWPE seals (2.6 mm I.D.), with the 0.5 mm I.D. reactor closest the discharge port. Water was pressurized (45,000 psig) and passed through two nozzles (0.1 mm I.D. and 0.13 mm I.D.) to produce water jets that entered this elongated chamber from opposite directions. A portion of silica powder (810-541) was introduced into this double-jet cell between the dominant water jet (from the 0.13 mm ID nozzle) and the elongated chamber. The slurry effluent was discharged at atmospheric pressure from this double-jet cell through an opening between the recessive water jet (from the 0.1 mm nozzle) and the elongated chamber. This slurry (813-498) was 2.9 weight percent solids, and the aggregate particle size was characterized by laser light scattering as follows: average 1.532 microns; median 0.302 microns; and 10 volume percent greater than 5.062 microns.

Example 29

Particle size reduction of another portion of this powder was conducted by using a double-jet cell that contained an elongated chamber of alumina reactors (6 reactors, 1 mm I.D.) and alternating UHMWPE seals (2.6 mm I.D.). Water was pressurized (45,000 psig) and passed through two nozzles (0.1 mm I.D. and 0.13 mm I.D.) to produce water jets that entered this elongated chamber from opposite directions. A portion of silica powder (810-541) was introduced into this double-jet cell between the dominant water jet (from the 0.13 mm ID nozzle) and the elongated chamber. The slurry effluent was discharged at atmospheric pressure from this double-jet cell through an opening between the recessive water jet (from the 0.1 mm nozzle) and the elongated chamber. This slurry (813-491) was 8.1 weight percent solids, and the aggregate particle size was characterized by laser light scattering as follows: average 0.149 microns; median 0.119 microns; and 10 volume percent greater than 0.289 microns.

Example 30

Particle size reduction of another portion of this powder was conducted by using a double-jet cell that contained an elongated chamber of alumina reactors (6 reactors, 1 mm I.D.) and alternating UHMWPE seals (2.6 mm I.D.). Water was pressurized (45,000 psig) and passed through two nozzles (0.1 mm I.D. and 0.13 mm I.D.) to produce water jets that entered this elongated chamber from opposite directions. A portion of silica powder (810-541) was introduced into this double-jet cell between the dominant water jet (from the 0.13 mm ID nozzle) and the elongated chamber. The slurry effluent was discharged at atmospheric pressure from this double-jet cell through an opening between the recessive water jet (from the 0.1 mm nozzle) and the elongated chamber. This slurry (813-492) was 6.5 weight percent solids, and the aggregate particle size was characterized by laser light scattering as follows: average 0.134 microns; median 0.113 microns; and 10 volume percent greater than 0.233 microns.

Comparative Examples of Various Silica Powder Feed to Dual Jet, Dual Feed Configuration These examples demonstrate that the slurry composition from the method by which silica powder is fed to a dual-water jet configuration having the specifications of alumina reactors (6 reactors, 1 mm I.D.) and alternating seals (2.6 mm I.D.) does not necessarily provide an effluent slurry having a completely sub-micron particle size distribution when operating at 45,000 psi. These examples indicate that the method for preparation of precipitated silica is critical to produce a slurry that is completely sub-micron by the dual jet, dual feed configuration.

Example 31

HiSil 233 Powder (678-594) showed the following properties: Nitrogen BET (5 point) 133 $m^2/g$; CTAB 135 $m^2/g$; 201 ml of dibutyl phthalate per 100 gm of anhydrous powder. The calculated surface roughness is 1.0.

Particle size reduction of a portion of this powder was conducted by using a double-jet cell that contained an elongated chamber of alumina reactors (6 reactors, 1 mm I.D.) and alternating UHMWPE seals (2.6 mm I.D.). Water was pressurized (45,000 psig) and passed through two nozzles (0.1 mm I.D. and 0.13 mm I.D.) to produce water jets that entered this elongated chamber from opposite directions. A portion of silica powder (678-594, 6.2 weight percent moisture) was introduced into this double-jet cell between the dominant water jet (from the 0.13 mm ID nozzle) and the elongated chamber. The slurry effluent was discharged at atmospheric pressure from this double-jet cell through an opening between the recessive water jet (from the 0.1 mm nozzle) and the elongated chamber. This slurry (813-679) was 12.10 weight percent solids, and the aggregate particle size was characterized by laser light scattering as follows: average 28.04 microns; median 22.72 microns; and 10 volume percent greater than 52.20 microns.

Example 32

HiSil 233 Powder (678-594) showed the following properties: Nitrogen BET (5 point) 133 $m^2/g$; CTAB 135 $m^2/g$; 201 ml of dibutyl phthalate per 100 gm of anhydrous powder. Particle size reduction of a portion of this powder was conducted by using a double-jet cell that contained an elongated chamber of alumina reactors (6 reactors, 1 mm I.D.) and alternating UHMWPE seals (2.6 mm I.D.). Water was pressurized (45,000 psig) and passed through two nozzles (0.1 mm I.D. and 0.13 mm I.D.) to produce water jets that entered this elongated chamber from opposite directions. A portion of silica powder (678-594, 6.2 weight percent moisture) was introduced into this double-jet cell between the dominant water jet (from the 0.13 mm ID nozzle) and the elongated chamber. The slurry effluent was discharged at atmospheric pressure from this double-jet cell through an opening between the recessive water jet (from the 0.1 mm nozzle) and the elongated chamber. This slurry (813-680) was 8.50 weight percent solids, and the aggregate particle size was characterized by laser light scattering as follows: average 12.85 microns; median 8.97 microns; and 10 volume percent greater than 29.75 microns.

Example 33

HiSil SBG Powder (715-6532) showed the following properties: Nitrogen BET (5 point) 147 $m^2/g$; 197 ml of dibutyl phthalate per 100 gm of anhydrous powder. Particle size reduction of a portion of this powder was conducted by using a double-jet cell that contained an elongated chamber of alumina reactors (6 reactors, 1 mm I.D.) and alternating UHMWPE seals (2.6 mm I.D.). Water was pressurized (45,000 psig) and passed through two nozzles (0.1 mm I.D. and 0.13 mm I.D.) to produce water jets that entered this elongated chamber from opposite directions. A portion of silica powder (715-6532) was introduced into this double-jet cell between the dominant water jet (from the 0.13 mm ID nozzle) and the elongated chamber. The slurry effluent was discharged at atmospheric pressure from this double-jet cell through an opening between the recessive water jet (from the 0.1 mm nozzle) and the elongated chamber. This slurry (813-686) was 10.50 weight percent solids, and the aggregate particle size was characterized by laser light scattering as follows: average 2.528 microns; median 0.251 microns; and 10 volume percent greater than 8.970 microns.

Example 34

HiSil SBG Powder (715-6532) showed the following properties: Nitrogen BET (5 point) 147 $m^2/g$; 197 ml of dibutyl phthalate per 100 gm of anhydrous powder. Particle size reduction of a portion of this powder was conducted by using a double-jet cell that contained an elongated chamber of alumina reactors (6 reactors, 1 mm I.D.) and alternating UHMWPE seals (2.6 mm I.D.). Water was pressurized (45,000 psig) and passed through two nozzles (0.1 mm I.D. and 0.13 mm I.D.) to produce water jets that entered this elongated chamber from opposite directions. A portion of silica powder (715-6532) was introduced into this double-jet cell between the dominant water jet (from the 0.13 mm ID nozzle) and the elongated chamber. The slurry effluent was discharged at atmospheric pressure from this double-jet cell through an opening between the recessive water jet (from the 0.1 mm nozzle) and the elongated chamber. This slurry (813-687) was 11.60 weight percent solids, and the aggregate particle size was characterized by laser light scattering as follows: average 2.487 microns; median 0.244 microns; and 10 volume percent greater than 8.881 microns.

Example 35

HiSil SBG Powder (715-6532) showed the following properties: Nitrogen BET (5 point) 147 $m^2/g$; 197 ml of dibutyl phthalate per 100 gm of anhydrous powder. Particle size reduction of a portion of this powder was conducted by using a double-jet cell that contained an elongated chamber of alumina reactors (6 reactors, 1 mm I.D.) and alternating UHMWPE seals (2.6 mm I.D.). Water was pressurized (45,000 psig) and passed through two nozzles (0.1 mm I.D. and 0.13 mm I.D.) to produce water jets that entered this elongated chamber from opposite directions. A portion of silica powder (715-6532) was introduced into this double-jet cell between the dominant water jet (from the 0.13 mm ID nozzle) and the elongated chamber. The slurry effluent was discharged at atmospheric pressure from this double-jet cell through an opening between the recessive water jet (from the 0.1 mm nozzle) and the elongated chamber. This slurry (813-688) was 13.70 weight percent solids, and the aggregate particle size was characterized by laser light scattering as follows: average 2.469 microns; median 0.257 microns; and 10 volume percent greater than 8.835 microns.

Example 36

HiSil 2000 Powder (623-1800) showed the following properties: Nitrogen BET (5 point) 234 $m^2/g$; CTAB 232 $m^2/g$; 326 ml of dibutyl phthalate per 100 gm of anhydrous powder. The calculated surface roughness is 1.0.

Particle size reduction of a portion of this powder was conducted by using a double-jet cell that contained an elongated chamber of alumina reactors (6 reactors, 1 mm I.D.) and alternating UHMWPE seals (2.6 mm I.D.). Water was pressurized (45,000 psig) and passed through two nozzles (0.1 mm I.D. and 0.13 mm I.D.) to produce water jets that entered this elongated chamber from opposite directions. A portion of silica powder (623-1800) was introduced into this double-jet cell between the dominant water jet (from the 0.13 mm ID nozzle) and the elongated chamber. The slurry effluent was discharged at atmospheric pressure from this double-jet cell through an opening between the recessive water jet (from the 0.1 mm nozzle) and the elongated chamber. This slurry (623-1801) was 10.96 weight percent solids, and the aggregate particle size was characterized by laser light scattering as follows: average 8.484 microns; median 0.402 microns; and 10 volume percent greater than 23.67 microns.

Examples 37-42

The compositions in the following examples were produced utilizing precipitated silica as an abrasive. The silica was prepared in accordance with the procedure described in Patent Application having Ser. No. 09/882,549 filed on Jun. 14, 2001. The precipitated silica had the following properties: Nitrogen BET (5-point) 133 $m^2/g$; CTAB 131 $m^2/g$; 15.9 percent by weight solids; particle size distribution as follows as determined by laser light scattering using a Coulter LS particle size analyzer. An average particle size of 0.131 microns; a median particle size of 0.113 microns; and 10 volume percent having a particle size greater than 0.213 microns, denoted herein as "high surface area precipitated silica".

The formulation components identified in the Examples were added to this abrasive to produce a CMP slurry (expressed as weight percent active ingredient). The resulting mixture was agitated with a Teflon-coated magnetic stir bar to dissolve the components and the pH was adjusted to within a range of from 4 to 6, using KOH (Fisher Scientific, Certified ACS, CAS Reg. 1310-58-3, diluted to 10 weight %) or $H_2SO_4$ (Fisher Scientific, Certified ACS Plus, CAS Reg. 7664-93-9, diluted to 10 weight %).

Example 37

This example was carried out to demonstrate the effect of picolinic acid on the copper removal rate.

Slurry sample 1a was prepared using 0.02% by weight benzotriazole, 10% by weight high surface area precipitated silica (757-876 F4), 4% by weight hydrogen peroxide, and the balance being water. The pH was adjusted to 5.6 using $H_2SO_4$.

Slurry sample 1b was prepared using 0.02% by weight benzotriazole, 10% by weight high surface area precipitated silica (757-876 F4), 4% by weight hydrogen peroxide, 0.8% by weight picolinic acid, and the balance being water. The pH was adjusted to 5.6 with KOH.

The material removal rate (MRR) was obtained using a Buehler-Vector/Phoenix Beta polishing system, type 60-1990. The polishing system was fitted with a Rodel IC1400 CMP pad. The substrate was a cast metal disk having a diameter of 1.25 inches and a thickness of approximately 0.75 inches. The pad was set to rotate at 150 RPM, and the disk holder was set to rotate at 60 RPM. A polishing force of 5 pounds was applied to the metal disk. The slurry samples were each pumped to the center of the pad at a rate of 60 ml/min. The removal rate was determined gravimetrically, weighing to the nearest 0.1 mg. MRR is expressed as Å/min.

| Slurry | Copper MRR (Å/min) |
| --- | --- |
| 1a—no picolinic acid | 1239 |
| 1b—0.8% picolinic acid | 4702 |

Example 38

In this example, slurry sample 2p was prepared and used in conjunction with a Rodel IC1400 polishing pad to polish 200 mm patterned copper wafers at a rate of greater than 5,000 Å/min on a Westech 472 polishing tool operating at 4 psi downforce, 3.2 PSI backpressure, 90 RPM table speed, 86 RPM carrier speed, 200 ml/min slurry flow rate.

Slurry sample 2p included 0.0119% by weight of benzotriazole, 1% by weight of glycine, 5% by weight of high surface area precipitated silica, and 5% by weight of hydrogen peroxide.

The following table lists the weight percent of picolinic acid, benzotriazole (BTA) and final slurry pH in compositions which further contained 6% high surface area precipitated silica and 4% hydrogen peroxide. This slurry provides a benchmark for determining adequate copper removal rate and also for comparisons of tantalum removal rate and static etch rate.

The material removal rate (MRR) was obtained using a Buehler-Vector/Phoenix Beta polishing system, type 60-1990 fitted with a Rodell IC1400 CMP pad. The substrates to be polished were cast metal disks having a diameter of 1.25 inches and a thickness of 0.75 inches. The pad was set to rotate at 150 RPM, and the disk holder was set to rotate at 60 RPM. A polishing pressure of 5 pounds was applied to the metal disks. The slurry samples were pumped to the center of the pad at a rate of 60 ml/min. The removal rate was determined gravimetrically, weighing to the nearest 0.1 mg. MRR is expressed as Å/min. For this experiment both copper and tantalum disks were polished simultaneously.

The copper static etch rate (SER) was determined by placing approximately 2.5 cm of a 0.1 mm thick, 2.54 cm wide 99.99% pure copper strip in a flask containing 100 g of the slurry sample. To the flask was added 4 g of a 2.5% $CuSO_4$ pentahydrate (Fisher Scientific, Certified ACS, CAS Reg. 7758-99-8) solution. The pH was adjusted; and the flask was then placed in a Controlled Environment Incubator Shaker (New Brunswick Scientific Co., Inc. Model G-25) for 30 minutes at 150 RPM and a temperature of 25° C. The etch rate was determined gravimetrically by weighing to the nearest 0.1 mg. SER is expressed as Å/min.

| Slurry | DOE Pattern | Picolinic Acid | BTA | pH | Cu MRR Å/min | Ta MRR Å/min | SER Å/min |
| --- | --- | --- | --- | --- | --- | --- | --- |
| 2a | +−0 | 0.5 | 0.015 | 6.0 | 2637 | 398 | 71 |
| 2b | 0−+ | 0.8 | 0.02 | 5.0 | 5591 | 550 | 174 |
| 2c | 0−− | 0.8 | 0.01 | 5.0 | 6480 | 417 | 220 |
| 2d | 000 | 0.8 | 0.015 | 5.5 | 5242 | 474 | 153 |
| 2e | −−0 | 0.5 | 0.015 | 5.0 | 5842 | 436 | 196 |
| 2f | −0− | 0.5 | 0.01 | 5.5 | 3558 | 493 | 129 |
| 2g | +0− | 1.1 | 0.01 | 5.5 | 5559 | 569 | 172 |
| 2h | 000 | 0.8 | 0.015 | 5.5 | 5146 | 474 | 147 |
| 2i | ++0 | 1.1 | 0.015 | 6.0 | 4511 | 910 | 161 |
| 2j | 0++ | 0.8 | 0.02 | 6.0 | 3050 | 664 | 77 |
| 2k | +−0 | 1.1 | 0.015 | 5.0 | 7211 | 569 | 212 |
| 2l | 000 | 0.8 | 0.015 | 5.5 | 6068 | 720 | 161 |
| 2m | −0+ | 0.5 | 0.02 | 5.5 | 3971 | 645 | 77 |
| 2n | 0+− | 0.8 | 0.01 | 6.0 | 3177 | 626 | 97 |
| 2o | +0+ | 1.1 | 0.02 | 5.5 | 5559 | 664 | 130 |
| 2p | x | x | 0.0119 | 5.0 | 6226 | 171 | 340 |

The examples in the above table demonstrate a range of formulations designed to clarify and model regions in which picolinic acid may produce adequate removal rates with lower static etch than glycine. The glycine formulation (slurry 2p) exhibits a high Cu MRR (i.e., 6226), with a high SER (i.e., 340). The results shown in the above table demonstrate that compositions (e.g., 2c and 2k) with picolinic acid can exhibit copper removal rates comparable to the benchmark glycine formulation (slurry sample 2p) while reducing static etch. The model predicts that SER may be reduced by 50% or greater at similar MRR. It is also predicted that benzotriazole has little if any effect on static etch and removal rate.

Example 39

Slurry sample 3a contained: 0.019% by weight benzotriazole, 6% by weight high surface area precipitated silica (757-876 F4), 4% by weight hydrogen peroxide, 1.1% by weight picolinic acid, and the balance of water. The pH was adjusted to 5.2 with KOH.

Sample 3b contained: 6% by weight high surface area precipitated silica (757-876 F4), 4% by weight hydrogen peroxide, 1.1% by weight picolinic acid, and the balance of water. The pH was adjusted to 5.2 with KOH.

Sample 3c included 0.012% by weight of benzotriazole, 1% by weight of glycine, 5% by weight of high surface area precipitated silica, and 5% by weight of hydrogen peroxide. The pH was adjusted to 5.0 with sulfuric acid.

The MRR and SER were obtained by means of the aforementioned procedures.

| Slurry | Cu MRR | Ta MRR | Cu SER |
| --- | --- | --- | --- |
| 3a | 5242 | 474 | 159 |
| 3b | 6087 | 455 | 213 |
| 3c | 5845 | 114 | 332 |

The results shown in the above table demonstrate that without the presence of a corrosion inhibitor such as benzotriazole, the presence of picolinic acid maintains a lower static etch rate than the glycine formulation with a corresponding high copper removal rate.

Example 40

The tantalum removal rate for the picolinic acid formulations in the preceeding examples was considerably higher than the glycine control and could potentially result in sub-optimum performance in copper wafer polishing. As a developmental tool, materials which suppress tantalum (i.e., histidine) were examined in the picolinic acid formulations. These formulations would be employed in the event that a lower tantalum removal rate was desired.

The slurries in this example contained 0.015% by weight benzotriazole, 0.7% by weight picolinic acid, 6% by weight high surface area precipitated silica, 4% by weight hydrogen peroxide, and the balance of water. The pH was adjusted to 5.2 using potassium hydroxide.

Sample 4a contained 0% histidine.
Sample 4b contained 0.02% histidine.
Sample 4c contained 0.05% histidine.

MRR and SER were obtained by means of the aforementioned procedures. The glycine control formulation was tested to provide a benchmark.

| Slurry | Cu MRR | Ta MRR | Cu SER |
|---|---|---|---|
| 4a—0% histidine | 4702 | 360 | 133 |
| 4b—0.02% histidine | 3844 | 114 | 125 |
| 4c—0.05% histidine | 3939 | 114 | 137 |
| 2p—glycine control | 5845 | 114 | 332 |

These results indicate that low levels of histidine lowered the tantalum removal rate in picolinic acid formulations with a relatively small effect on Cu SER. Furthermore, the results show that the presence of histidine reduces Ta MRR, but the presence of histidine in a greater amount does not produce a further reduction in Ta-MRR.

Example 41

The following materials which are similar in chemical structure to picolinic acid (a.k.a. 2-pyridinecarboxylic acid) were tested: nicotinic acid (a.k.a. 3-picolinic acid, or 3-pyridinecarboxylic acid), dipicolinic acid (a.k.a. 2,6'-pyridinedicarboxylic acid) and quinolinic acid (a.k.a. 2,3'-pyridinedicaboxylic acid).

Slurry sample 5a contained 0.01% by weight benzotriazole, 5% by weight high surface area precipitated silica (757-876 F4), 5% by weight hydrogen peroxide, 0.9% by weight picolinic acid, and the balance of water. The pH was adjusted to 5.3 with KOH.

Slurry sample 5b contained 0.01% by weight benzotriazole, 5% by weight high surface area precipitated silica (757-876 F4), 5% by weight hydrogen peroxide, 0.9% by weight nicotinic acid, and the balance of water. The pH was adjusted to 5.3 with KOH.

Slurry sample 5c contained 0.01% by weight benzotriazole, 5% by weight high surface area precipitated silica (757-876 F4), 5% by weight hydrogen peroxide, 0.9% by weight dipicolinic acid, and the balance of water. The pH was adjusted to 5.3 with KOH.

Slurry sample 5d contained 0.01% by weight benzotriazole, 5% by weight high surface area precipitated silica (757-876 F4), 5% by weight hydrogen peroxide, 0.9% by weight quinolinic acid, and the balance of water. The pH was adjusted to 5.3 with KOH.

MRR and SER were obtained by means of the aforementioned procedures. The glycine control formulation was also tested as a benchmark.

| Slurry | Cu MRR | Ta MRR | Cu SER |
|---|---|---|---|
| 5a—picolinic acid | 5972 | 417 | 181 |
| 5b—nicotinic acid | 826 | 569 | 2 |
| 5c—dipicolinic acid | 3495 | 758 | 201 |
| 5d—quinolinic acid | 3495 | 796 | 181 |

These results demonstrate that picolinic acid is a preferred material while dipicolinic and quinolinic are less preferred and nicotinic acid is nearly ineffectual.

Example 42

Slurry samples containing picolinic acid, dipicolinic acid, and quinolinic acid were tested without oxidizing agent for use in the polishing step in which a lower copper removal rate and a higher tantalum (barrier) removal rate were desired. These slurries were compared to a slurry containing potassium iodate as an oxidizer.

Sample 6a contained 6.5% by weight high surface area precipitated silica at a pH of 5.5.

Sample 6b contained 6.5% by weight of high surface area precipitated silica, 0.19% by weight of potassium hydroxide, 0.6% by weight of picolinic acid; at a pH of 5.5.

Sample 6c contained 6.5% by weight of high surface area precipitated silica, 0.33% by weight of potassium hydroxide, 0.6% by weight of dipicolinic acid; at a pH of 5.5.

Sample 6d contained 6.5% by weight of high surface area precipitated silica, 0.33% by weight of potassium hydroxide, 0.6% by weight of quinolinic acid; at a pH of 5.5.

Sample 6e contained 11% by weight of high surface area precipitated silica, 0.02% by weight of potassium iodate, 0.05% by weight of benzotriazole; at a pH of 5.5.

The MRRs were obtained by means of the aforementioned procedures.

| Slurry | Cu MRR | Ta MRR | Cu:Ta ratio |
|---|---|---|---|
| 6a | 63.5 | 417.1 | 1:6.6 |
| 6b—picolinic acid | 127.1 | 568.8 | 1:4.5 |
| 6c—dipicolinic acid | 211.8 | 657.3 | 1:3.1 |
| 6d—quinolinic acid | 127.1 | 505.6 | 1:4.0 |

These results demonstrate that picolinic, dipicolinic and quinolinic acid can achieve elevated copper removal rates without the need for added oxidizing agent in slurries where a tantalum removal rate of two to four times higher than the copper removal rate is desired, while maintaining high tantalum removal rate.

Example 43

Examples of the Effect of Polyacrylic Acid on Particle Settling

Procedure 00-SDH-1481. Silica was prepared by batch precipitation in a 150 liter stirred tank reactor. Water (75 liters) was heated to 205° F., and aqueous potassium silicate (1.2 liters, 110.5 gm $K_2O$/liter) was added. This stirred solution was neutralized to pH 7.5. After 5 minutes, potassium silicate solution (31.7 liters) and concentrated sulfuric acid (2.03 liters) were added simultaneously over a period of 45 minutes. The resulting slurry was allowed to stir at 205° F. for an additional 80 minutes at pH 8.5, and then was acidified to pH 4.2. A portion of the product slurry was filtered, and water washed. The resulting filtercake was liquefied by high shear, adjusted to pH 6.3, and a portion of this slurry was spray dried to produce a white powder (810-846, 2.6 kg, 2.40 weight percent moisture). Analysis of this powder showed the following properties: Nitrogen BET (5-point) 83 m$^2$/g; CTAB 82 m$^2$/g; 200 milliliters of dibutyl phthalate per 100 gm of anhydrous powder.

Particle size reduction was conducted by using a double-jet cell that contained an elongated chamber of alumina reactors (6 reactors, 1 mm ID) and alternating UHMWPE seals (2.6 mm ID). Water was pressurized (45,000 psig) and passed through two nozzles (0.1 mm ID and 0.13 mm ID) to produce water jets that entered this elongated chamber from opposite directions. A portion of spray-dried powder (810-846) was introduced into this double-jet cell between the dominant water jet (from the 0.13 mm ID nozzle) and the elongated chamber. The slurry effluent was discharged at atmospheric pressure from this double-jet cell through an opening between the recessive water jet (from the 0.1 mm nozzle) and the elongated chamber. This slurry (813-1080) was 16.26 weight percent solids, and the particle size was characterized by laser light scattering as follows: average 0.216 microns; median 0.176 microns; and 10 volume percent greater than 0.418 microns.

To a portion of this slurry (813-1080, 16.26 weight percent solids) was added deionized water to provide a more dilute slurry (9.95 weight percent solids). To a portion of this slurry 813-1080 (200 grams, 9.95 weight percent solids, pH 7.2) was added 0.4 grams of Ammonium Hydroxide (Fisher Scientific, Certified A.C.S Plus, 29.6% Assay, Lot No. 993583) while agitating moderately. After agitating moderately for approximately for 10 minutes, the pH of this slurry was 10. A 40-milliliter sample of this slurry (813-1101) was then placed in a graduated 50 milliliter Nalgene centrifuge tube.

To another portion of slurry 813-1080 (200 grams, 9.95 weight percent solids, pH 7.2) was added 6.5 grams of Triethanolamine (Aldrich, 98% Assay, Lot No. 05010PU) while agitating moderately. After agitating moderately for approximately for 10 minutest the pH of this slurry was 9.8. A 40-milliliter sample of this slurry (813-1102) was then placed in a graduated 50 milliliter Nalgene centrifuge tube.

To another portion of slurry 813-1080 (200 grams, 9.95 weight percent solids, pH 7.2) was added 0.20 grams (0.1% w/w) of 813-888 Carbopol ETD-2691 (BF Goodrich, Lot No. CC01LED279) while agitating moderately. The Carbopol powder was added to the vortex formed by moderate agitation, and the pH of the slurry dropped to 4.34 after 15 minutes of agitation. To a portion of this slurry was added 15 drops of Ammonium Hydroxide (Fisher Scientific, Certified A.C.S Plus, 29.6% Assay, Lot No. 993583) while agitating moderately. After agitating moderately for approximately for 10 minutes, the pH of this slurry was 10. A 40-milliliter sample of this slurry (813-1097) was then placed in a graduated 50 milliliter Nalgene centrifuge tube. To another portion of this slurry was added 7.0 grams of Triethanolamine (Aldrich, 98% Assay, Lot No. 05010PU) while agitating moderately. After agitating moderately for approximately for 10 minutes, the pH of this slurry was 9.8. A 40-milliliter sample of this slurry (813-1098) was then placed in a graduated 50 milliliter Nalgene centrifuge tube.

To another portion of slurry 813-1080 (400 grams, 9.95 weight percent solids, pH 7.2) was added 0.20 grams (0.05% w/w) of 813-888 Carbopol ETD-2691 (BF Goodrich, Lot No. CC01LED279) while agitating moderately. The Carbopol powder was added to the vortex formed by moderate agitation, and the pH of the slurry dropped to 4.92 after 15 minutes of agitation. To a portion of this slurry was added 0.8 grams of Ammonium Hydroxide (Fisher Scientific, Certified A.C.S Plus, 29.6% Assay, Lot No. 993583) while agitating moderately to adjust the pH of the slurry to 10. A 40-milliliter sample of this slurry (813-1099) was then placed in a graduated 50 milliliter Nalgene centrifuge tube. To another portion of this slurry was added 11.0 grams of Triethanolamine (Aldrich, 98% Assay, Lot No. 05010PU) while agitating moderately to adjust the pH of the slurry to 9.8. A 40-milliliter sample of this slurry (813-1100) was then placed in a graduated 50 milliliter Nalgene centrifuge tube.

The Nalgene tubes containing 813-1097 through 813-1102 were then shaken vigorously. Upon inversion of these tubes, no sediment was evident in any of the tubes, and thus the sediment or settling test was begun.

The contents of the tubes were allowed to stand, and were not disturbed except for inversion to measure the settling volume at elapsed times of 1 day, 6 days, 23 days, 32 days, and 75 days. At these specified intervals, each tube was briefly inverted, and the visible settling volume by was recorded in milliliters. Following inversion, the tubes were returned to a stand that held the tubes vertical between time intervals.

The relative settling volume, or settling volume as a percent of original volume, for each sample, at each specified interval was then calculated by dividing the measured settling volume in milliliters by the total volume of each sample (40 milliliters for all samples) and multiplying by 100%. The resulting data are given in the following table.

| | Settling Volume (mL) | | | | | Relative Settling Volume | | | | |
|---|---|---|---|---|---|---|---|---|---|---|
| Sample ID | 1 day | 6 days | 23 days | 32 days | 75 days | 1 day | 6 days | 23 days | 32 days | 75 days |
| 813-1097 | Cling | Cling | Cling | Cling | Cling | 0 | 0 | 0 | 0 | 0 |
| 813-1098 | Cling | Cling | Cling | Cling | Cling | 0 | 0 | 0 | 0 | 0 |
| 813-1099 | 0 | 0 | Cling | Cling | Cling | 0 | 0 | 0 | 0 | 0 |
| 813-1100 | 0 | 0 | 0 | 0 | 0 | 0 | 0 | 0 | 0 | 0 |
| 813-1101 | .375 | 1 | 1.5 | 1.75 | 2 | .9375 | 2.50 | 3.75 | 4.375 | 5.0 |
| 813-1102 | .375 | 1 | 1.375 | 1.5 | 2 | .9375 | 2.50 | 3.4375 | 3.75 | 5.0 |

Example 44

Procedure 00-SDH-1484. Silica was prepared by batch precipitation in a 150 liter stirred tank reactor. Water (75 liters) was heated to 205° F., and aqueous potassium silicate (1.2 liters, 111.5 gm $K_2O$/liter) was added. This stirred solution was neutralized to pH 8.5. After 5 minutes, potassium silicate solution (31.7 liters) and concentrated sulfuric acid (2.03 liters) were added simultaneously over a period of 45 minutes. The resulting slurry was allowed to stir at 205° F. for an additional 80 minutes at pH 8.5, and then was acidified to pH 4.2. A portion of the product slurry was filtered, and water washed. The resulting filtercake was liquefied by high shear, adjusted to pH 6.3, and a portion of this slurry was spray dried to produce a white powder (810-858, 3.64 kg, 3.39 weight percent moisture). Analysis of this powder showed the following properties: Nitrogen BET (5-point) 91 $m^2/g$; CTAB 90 $m^2/g$; 256 milliliters of dibutyl phthalate per 100 gm of anhydrous powder.

Particle size reduction was conducted by using a double-jet cell that contained an elongated chamber of alumina reactors (6 reactors, 1 mm ID) and alternating UHMWPE seals (2.6 mm ID). Water was pressurized (45,000 psig) and passed through two nozzles (0.1 mm ID and 0.13 mm ID) to produce water jets that entered this elongated chamber from opposite directions. A portion of spray-dried powder (810-858) was introduced into this double-jet cell between the dominant water jet (from the 0.13 mm ID nozzle) and the elongated chamber. The slurry effluent was discharged at atmospheric pressure from this double-jet cell through an opening between the recessive water jet (from the 0.1 mm nozzle) and the elongated chamber. This slurry (813-1112) was 10.45 weight percent solids, and the particle size was characterized by laser light scattering as follows: average 0.214 microns; median 0.177 microns; and 10 volume percent greater than 0.407 microns.

To this slurry (813-1112, 10.45 weight percent solids) was added deionized water to provide a more dilute slurry (813-1113, 10.05 weight percent solids). A 40-milliliter sample of this slurry (813-1113, 10.05 weight percent solids, pH 7.2) was then placed in a 50 milliliter Nalgene centrifuge tube.

To another portion of slurry 813-1113 (200 grams, 10.05 weight percent solids, pH 7.2) was added 1 drop of Hydrochloric Acid (Fisher Scientific, Certified A.C.S Plus, 37.6% Assay, Lot No. 993602) while agitating moderately. After agitating moderately for approximately for 10 minutes, the pH of this slurry was 3.90. A 40-milliliter sample of this slurry (813-1114) was then placed in a 50 milliliter Nalgene centrifuge tube.

To another portion of slurry 813-1113 (200 grams, 10.05 weight percent solids, pH 7.2) was added 0.10 grams of Carbopol ETD-2691 (813-888) while agitating moderately. The Carbopol powder was added to the vortex formed by moderate agitation, and the pH of the slurry dropped to 5.38 upon addition. To this slurry was added 1 drop of Hydrochloric Acid (Fisher Scientific, Certified A.C.S Plus, 37.6% Assay, Lot No. 993602) while agitating moderately. After agitating moderately for approximately for 10 minutes, the pH of this slurry was 3.91. A 40-milliliter sample of this slurry (813-1115) was then placed in a 50 milliliter Nalgene centrifuge tube.

To another portion of slurry 813-1113 (200 grams, 10.05 weight percent solids, pH 7.2) was added 0.05 grams of Carbopol ETD-2691 (813-888) while agitating moderately. The Carbopol powder was added to the vortex formed by moderate agitation. The pH of the slurry dropped to 5.38 upon addition. To this slurry was added 1 drop of Hydrochloric Acid (Fisher Scientific, Certified A.C.S Plus, 37.6% Assay, Lot No. 993602) while agitating moderately. After agitating moderately for approximately for 10 minutes, the pH of this slurry was 3.95. A 40-milliliter sample of this slurry (813-1116) was then placed in a 50 milliliter Nalgene centrifuge tube.

To another portion of slurry 813-1113 (200 grams, pH 7.2) was added 0.20 grams of Carbopol ETD-2691 (813-888) while agitating moderately. The Carbopol powder was added to the vortex formed by moderate agitation. The pH of the slurry dropped to 5.15 upon addition. To this slurry was added 1 drop of Hydrochloric Acid (Fisher Scientific, Certified A.C.S Plus, 37.6% Assay, Lot No. 993602) while agitating moderately. After agitating moderately for approximately for 10 minutes, the pH of this slurry was 4.01. A 40-milliliter sample of this slurry (813-1117) was then placed in a 50 milliliter Nalgene centrifuge tube.

The Nalgene tubes containing 813-1113 through 813-1117 were then shaken vigorously. Upon inversion of these tubes, no sediment was evident in any of the tubes, and thus the sediment or settling test was begun.

The contents of the tubes were allowed to stand, and were not disturbed except for inversion to measure the settling volume at elapsed times of 2 days, 6 days, 50 days, and 85 days. At these specified intervals, each tube was briefly inverted, and the visible settling volume by was recorded in milliliters. Following inversion, the tubes were returned to a stand that held the tubes vertical between time intervals.

The relative settling volume, or settling volume as a percent of original volume, for each sample, and at each specified interval was then calculated by dividing the measured settling volume in milliliters by the total volume of each sample (40 milliliters for all samples) and multiplying by 100%. The resulting data are given in the following table.

| | Volume of Sediment | | | | Relative Volume of Sediment | | | |
|---|---|---|---|---|---|---|---|---|
| Sample ID | 2 days | 6 days | 50 days | 85 days | 2 days | 6 days | 50 days | 85 days |
| 813-1113 | 0.250 | 0.500 | 0.500 | 0.500 | 0.625 | 1.250 | 1.250 | 1.250 |
| 813-1114 | 0.250 | 0.375 | 1.000 | 1.500 | 0.625 | 0.938 | 2.500 | 3.750 |
| 813-1116 | 0.125 | 0.250 | 0.688 | 1.000 | 0.313 | 0.625 | 1.719 | 2.500 |
| 813-1115 | 0.125 | 0.125 | 0.375 | 0.375 | 0.313 | 0.313 | 0.938 | 0.938 |
| 813-1117 | 0.050 | 0.050 | 0.050 | 0.050 | 0.125 | 0.125 | 0.125 | 0.125 |

Example 45

Examples of Formulation for Copper Step 1 CMP

A precipitated silica slurry of the present invention prepared in accordance with the methods disclosed in prior examples suitable for formulation for copper (or copper alloy) and tantalum chemical mechanical planarization was obtained with the following properties: Nitrogen BET (5-point) 133 $m^2/g$, CTAB 131 $m^2/g$, 15.9 weight percent solids with a particle size distribution determined by laser light scattering as follows: average 0.131 microns, median 0.113 microns, and 10 volume percent greater than 0.213 microns.

To this slurry was added formulation components to produce the following slurries (expressed as weight percent active ingredient) and pH adjusted to 5.0 using KOH (Fisher Scientific, Certified ACS, CAS Reg. 1310-58-3, diluted to 10 weight %) or $H_2SO_4$ (Fisher Scientific, Certified ACS Plus, CAS Reg. 7664-93-9, diluted to 10 weight %):
   (A) 11% silica, 0.0119% BTA, 4% hydrogen peroxide.
   (B) 11% silica, 0.0119% BTA, 4% hydrogen peroxide, 0.1% GoodRite K-702
   (C) 11% silica, 0.0119% BTA, 4% hydrogen peroxide, 0.2% GoodRite K-702

BTA is benzotriazole (Fisher Scientific, Certified, CAS Reg. 98-88-4), hydrogen peroxide is supplied at 30% (Fisher Scientific, Certified ACS, CAS Reg. 7722-84-1), GoodRite K-702 is 240,000 molecular weight (by GPC) polyacrylate homopolymer available from BFGoodrich.

Material removal rate (MRR) was obtained using a Buehler-Vector/Phoenix Beta polishing system, type 60-1990 fitted with a Rodell IC1400 CMP pad, polishing cast metal disks 1.25 inches in diameter, approximately 0.75 inches thick. The pad and disk holder were set to rotate at 150 RPM. A polishing pressure of 5 pounds was applied to the metal disks. Slurry was pumped to the center of the pad at a rate of 60 ml/min. Removal rate was determined gravimetrically, weighing to the nearest 0.1 mg. MRR is expressed as Å/min.

Copper static etch rate (SER) was determined by placing approximately 10 cm of 16 gage copper wire in a flask containing 100 g of slurry to which 4 g of a 2.5% $CuSO_4$ pentahydrate (Fisher Scientific, Certified ACS, CAS Reg. 7758-99-8) solution was added and pH adjusted back to 5.0. The flask was then placed in a Controlled Environment Incubator Shaker (New Brunswick Scientific Co., Inc. Model G-25) for 30 minutes at 150 RPM and 25° C. The etch rate was determined gravimetrically by weighing to the nearest 0.1 mg. SER is expressed as Å/min.

| Slurry | Copper MRR | Tantalum MRR | Copper SER |
|--------|------------|--------------|------------|
| (A)    | 1694       | 316          | 0          |
| (B)    | 1885       | 581          | 25         |
| (C)    | 2203       | 695          | 132        |

This result demonstrates that in the absence of any additional metal chelator or sequestering agent, polyacrylic acid enhances both the material removal rate as well as the static etch rate. Increasing the static etch rate is undesirable due to the fact that planarization efficiency (the removal rate in high points versus low points on the subtrate surface) suffers and dishing and erosion of recessed features such as in copper dual damascene patterned wafers increases. Increasing the removal rate is desirable since removal rates as high as 5,000 Å/min are needed to meet typical wafer polishing process requirements. It should be noted that this result demonstrates that polyacrylic acid in the presence of hydrogen peroxide does not serve as a corrosion inhibitor, and appears to have opposite effect.

Example 46

A precipitated silica slurry for copper (or copper alloy) and tantalum chemical mechanical planarization wherein the silica was prepared in accordance with the description in Example 13, and had the following properties: Nitrogen BET (5-point) 133 $m^2/g$, CTAB 131 $m^2/g$, 15.9 weight percent solids with a particle size distribution determined by laser light scattering as follows: average 0.131 microns, median 0.113 microns, and 10 volume percent greater than 0.213 microns.

To this slurry was added formulation components to produce the following slurries (expressed as weight percent active ingredient) and pH adjusted to 5.0 using KOH (Fisher Scientific, Certified ACS, CAS Reg. 1310-58-3, diluted to 10 weight %) or $H_2SO_4$ (Fisher Scientific, Certified ACS Plus, CAS Reg. 7664-93-9, diluted to 10 weight %):
   (E) 11% silica, 1% glycine, 0.0119% BTA, 4% hydrogen peroxide.
   (F) 11% silica, 1% glycine, 0.0119% BTA, 4% hydrogen peroxide, 0.1% GoodRite K-702
   (G) 11% silica, 1% glycine, 0.0119% BTA, 4% hydrogen peroxide, 0.2% GoodRite K-702

Glycine (Fisher Scientific, USP, CAS Reg. 56-40-6), BTA is benzotriazole (Fisher Scientific, Certified, CAS Reg. 98-88-4), hydrogen peroxide is supplied at 30% (Fisher Scientific, Certified ACS, CAS Reg. 7722-84-1), GoodRite K-702 is 240,000 molecular weight (by GPC) polyacrylate homopolymer available from BFGoodrich.

Material removal rate (MRR) was obtained using a Buehler-Vector/Phoenix Beta polishing system, type 60-1990 fitted with a Rodell IC1400 CMP pad, polishing cast metal disks 1.25 inches in diameter, approximately 0.75 inches thick. The pad and disk holder were set to rotate at 150 RPM. A polishing pressure of 5 pounds was applied to the metal disks. Slurry was pumped to the center of the pad at a rate of 60 ml/min. Removal rate was determined gravimetrically, weighing to the nearest 0.1 mg. MRR is expressed as Å/min.

Copper static etch rate (SER) was determined by placing approximately 10 cm of 16 gage copper wire in a flask containing 100 g of slurry to which 4 g of a 2.5% $CuSO_4$ pentahydrate (Fisher Scientific, Certified ACS, CAS Reg. 7758-99-8) solution was added and pH adjusted back to 5.0. The flask was then placed in a Controlled Environment Incubator Shaker (New Brunswick Scientific Co., Inc. Model G-25) for 30 minutes at 150 RPM and 25° C. The etch rate was determined gravimetrically by weighing to the nearest 0.1 mg. SER is expressed as Å/min.

| Slurry | Copper MRR | Tantalum MRR | Copper SER |
|--------|------------|--------------|------------|
| (E)    | 5580       | 386          | 781        |
| (F)    | 4161       | 246          | 595        |
| (G)    | 4458       | 367          | 564        |

This result demonstrates that in presence of very good metal chelating agents such as glycine, polyacrylic acid actually suppresses both the material removal rate as well as the static etch rate. In this particular formulation the effect on removal rate was enough to lower it to an undesirable level, while the static etch rate remains quite high.

Example 47

A precipitated silica slurry of the present invention prepared in accordance with the methods disclosed in Example 13 for formulation for copper (or copper alloy) and tantalum chemical mechanical planarization was obtained with the following properties: Nitrogen BET (5-point) 133 $m^2/g$, CTAB 131 $m^2/g$, 15.9 weight percent solids with a particle size distribution determined by laser light scattering as follows: average 0.131 microns, median 0.113 microns, and 10 volume percent greater than 0.213 microns.

To this slurry was added formulation components to produce the following slurries (expressed as weight percent active ingredient)-and pH adjusted to 5.0 using KOH (Fisher Scientific, Certfied ACS, CAS Reg. 1310-58-3, diluted to 10 weight %) or $H_2SO_4$ (Fisher Scientific, Certified ACS Plus, CAS Reg. 7664-93-9, diluted to 10 weight %):
- (I) 11% silica, 0.75% histidine, 0.0119% BTA, 4% hydrogen peroxide.
- (J) 11% silica, 0.75% histidine, 0.0119% BTA, 4% hydrogen peroxide, 0.1% GoodRite K-702
- (K) 11% silica, 0.75% histidine, 0.0119% BTA, 4% hydrogen peroxide, 0.2% GoodRite K-702

Histidine (Aldrich, 98%, CAS Reg. 4889-57-6), BTA is benzotriazole (Fisher Scientific, Certified, CAS Reg. 98-88-4), hydrogen peroxide is supplied at 30% (Fisher Scientific, Certified ACS, CAS Reg. 7722-84-1), GoodRite K-702 is 240,000 molecular weight (by GPC) polyacrylate homopolymer available from BFGoodrich.

Material removal rate (MRR) was obtained using a Buehler-Vector/Phoenix Beta polishing system, type 60-1990 fitted with a Rodell IC1400 CMP pad, polishing cast metal disks 1.25 inches in diameter, approximately 0.75 inches thick. The pad and disk holder were set to rotate at 150 RPM. A polishing pressure of 5 pounds was applied to the metal disks. Slurry was pumped to the center of the pad at a rate of 60 ml/min. Removal rate was determined gravimetrically, weighing to the nearest 0.1 mg. MRR is expressed as Å/min.

Copper static etch rate (SER) was determined by placing approximately 10 cm of 16 gage copper wire in a flask containing 100 g of slurry to which 4 g of a 2.5% $CuSO_4$ pentahydrate (Fisher Scientific, Certified ACS, CAS Reg. 7758-99-8) solution was added and pH adjusted back to 5.0. The flask was then placed in a Controlled Environment Incubator Shaker (New Brunswick Scientific Co., Inc. Model G-25) for 30 minutes at 150 RPM and 25° C. The etch rate was determined gravimetrically by weighing to the nearest 0.1 mg. SER is expressed as Å/min.

| Slurry | Copper MRR | Tantalum MRR | Copper SER |
|---|---|---|---|
| (I) | 9958 | 95 | 1224 |
| (J) | 7571 | 190 | 378 |
| (K) | 5030 | 114 | 342 |

This result demonstrates once again that in presence of very good metal chelator such as histidine, polyacrylic acid actually suppresses both the material removal rate as well as the static etch rate. In this formulation the surprising result is that histidine not only provides a much higher MRR than glycine, but also that the SER is affected to a greater extent. This discovery allows for the formulation of a slurry with very high selectivity to copper over tantalum, a sufficiently high copper MRR and a greatly improved SER/MRR ratio.

Example 48

A precipitated silica slurry of the present invention prepared in accordance with the methods disclosed in prior examples suitable for formulation for copper (or copper alloy) and tantalum chemical mechanical planarization was obtained with the following properties: Nitrogen BET (5-point) 133 m²/g, CTAB 131 m²/g, 15.9 weight percent solids with a particle size distribution determined by laser light scattering as follows: average 0.131 microns, median 0.113 microns, and 10 volume percent greater than 0.213 microns.

To this slurry was added formulation components to produce the following slurries (expressed as weight percent active ingredient) and pH adjusted to 5.0 using KOH (Fisher Scientific, Certfied ACS, CAS Reg. 1310-58-3, diluted to 10 weight %) or $H_2SO_4$ (Fisher Scientific, Certified ACS Plus, CAS Reg. 7664-93-9, diluted to 10 weight %):
- (M) 11% silica, 0.25% histidine, 0.0119% BTA, 4% hydrogen peroxide, 0.1% GoodRite K-702
- (N) 11% silica, 0.50% histidine, 0.0119% BTA, 4% hydrogen peroxide, 0.1% GoodRite K-702

Histidine (Aldrich, 98%, CAS Reg. 4889-57-6), BTA is benzotriazole (Fisher Scientific, Certified, CAS Reg. 98-88-4), hydrogen peroxide is supplied at 30% (Fisher Scientific, Certified ACS, CAS Reg. 7722-84-1), GoodRite K-702 is 240,000 molecular weight (by GPC) polyacrylate homopolymer available from BFGoodrich.

Material removal rate (MRR) was obtained using a Buehler-Vector/Phoenix Beta polishing system, type 60-1990 fitted with a Rodell IC1400 CMP pad, polishing cast metal disks 1.25 inches in diameter, approximately 0.75 inches thick. The pad and disk holder were set to rotate at 150 RPM. A polishing pressure of 5 pounds was applied to the metal disks. Slurry was pumped to the center of the pad at a rate of 60 ml/min. Removal rate was determined gravimetrically, weighing to the nearest 0.1 mg. MRR is expressed as Å/min.

Copper static etch rate (SER) was determined by placing approximately 10 cm of 16 gage copper wire in a flask containing 100 g of slurry to which 4 g of a 2.5% $CuSO_4$ pentahydrate (Fisher Scientific, Certified ACS, CAS Reg. 7758-99-8) solution was added and pH adjusted back to 5.0. The flask was then placed in a Controlled Environment Incubator Shaker (New Brunswick Scientific Co., Inc. Model G-25) for 30 minutes at 150 RPM and 25° C. The etch rate was determined gravimetrically by weighing to the nearest 0.1 mg. SER is expressed as Å/min.

| Slurry | Copper MRR | Tantalum MRR | Copper SER |
|---|---|---|---|
| (M) | 5718 | 32 | 70 |
| (N) | 6015 | 101 | 61 |

This result further substantiates the ability for formulations containing histidine and polyacrylic acid to provide high copper removal rate, high selectivity to copper over tantalum, and low copper static etch rate. The net result is shown to be superior to a formulation containing glycine either with or without polyacrylic acid.

Example 49

Examples of Formulation for Copper Step 2 Tantalum Barrier CMP

A precipitated silica slurry of the present invention prepared in accordance with the methods disclosed in prior examples suitable for formulation for copper (or copper alloy) and tantalum chemical mechanical planarization was obtained with the following properties: Nitrogen BET (5-point) 91 m²/g, CTAB 90 m²/g, 15.0 weight percent solids with a particle size distribution determined by laser light scattering as follows: average 0.214 microns, median 0.177 microns, and 10 volume percent greater than 0.407 microns.

To this slurry was added formulation components to produce the following slurries (expressed as weight percent active ingredient) and pH adjusted to 5.5 using KOH (Fisher Scientific, Certfied ACS, CAS Reg. 1310-58-3, diluted to 10 weight %) or $H_2SO_4$ (Fisher Scientific, Certified ACS Plus, CAS Reg. 7664-93-9, diluted to 10 weight %):

- (O) 5% silica, 0.005% $KIO_3$ (50 ppm), 0.1% Brij-35, 0.05 Carbopol ETD-2691
- (P) 5% silica, 0.010% $KIO_3$ (100 ppm), 0.1% Brij-35, 0.05 Carbopol ETD-2691
- (Q) 5% silica, 0.050% $KIO_3$ (500 ppm), 0.1% Brij-35, 0.05 Carbopol ETD-2691
- (R) 5% silica, 0.700% $KIO_3$ (7000 ppm), 0.1% Brij-35, 0.05 Carbopol ETD-2691

KIO3 is potassium iodate (Fisher Scientific, Certified ACS, CAS Reg. 7758-05-6), Brij-35 is a nonionic detergent (Fisher Scientific, CAS Reg. 9002-92-0, Brij is a trademark of ICI Americas), Carbopol ETD-2691 is a high molecular weight polyacrylic acid crosslinked with polyalkenyl polyether, available from BF Goodrich.

Material removal rate (MRR) was obtained using a Buehler-Vector/Phoenix Beta polishing system, type 60-1990 fitted with a Rodell IC1400 CMP pad, polishing cast metal disks 1.25 inches in diameter, approximately 0.75 inches thick. The pad and disk holder were set to rotate at 150 RPM. A polishing pressure of 5 pounds was applied to the metal disks. Slurry was pumped to the center of the pad at a rate of 60 ml/min. Removal rate was determined gravimetrically, weighing to the nearest 0.1 mg. MRR is expressed as Å/min.

| Slurry | Copper MRR | Tantalum MRR |
| --- | --- | --- |
| (O) | 113 | 413 |
| (P) | 226 | 472 |
| (Q) | 847 | 388 |
| (R) | 1400 | 455 |

This example demonstrates the utility of the silica abrasive system of the present invention for formulating slurries with adjustable copper-to-tantalum selectivity, including selectivity requirements which require tantalum removal rates to be substantially higher than copper removal rates (e.g. a tantalum removal rate equal to three times the copper removal rate).

Example 50

A precipitated silica slurry of the present invention prepared in accordance with the methods disclosed in prior examples suitable for formulation for copper (or copper alloy) and tantalum chemical mechanical planarization was obtained with the following properties: Nitrogen BET (5-point) 91 m²/g, CTAB 90 m²/g, 15.0 weight percent solids with a particle size distribution determined by laser light scattering as follows: average 0.214 microns, median 0.177 microns, and 10 volume percent greater than 0.407 microns. For the purpose of this example this slurry is designated "Low Surface Area".

To this slurry was added formulation components to produce the following slurries (expressed as weight percent active ingredient) and pH adjusted to 5.5 using KOH (Fisher Scientific, Certfied ACS, CAS Reg. 1310-58-3, diluted to 10 weight %) or $H_2SO_4$ (Fisher Scientific, Certified ACS Plus, CAS Reg. 7664-93-9, diluted to 10 weight %):

- (S) 10% of the above "Low Surface Area" abrasive, 0.05% BTA, 0.02% $KIO_3$.

A precipitated silica slurry of the present invention prepared in accordance with the methods disclosed in prior examples suitable for formulation for copper (or copper alloy) and tantalum chemical mechanical planarization was obtained with the following properties: Nitrogen BET (5-point) 133 m²/g, CTAB 131 m²/g, 15.9 weight percent solids with a particle size distribution determined by laser light scattering as follows: average 0.131 microns, median 0.113 microns, and 10 volume percent greater than 0.213 microns. For the purpose of this example this slurry is designated "High Surface Area".

To this slurry was added formulation components to produce the following slurries (expressed as weight percent active ingredient) and pH adjusted to 5.5 using KOH (Fisher Scientific, Certfied ACS, CAS Reg. 1310-58-3, diluted to 10 weight %) or $H_2SO_4$ (Fisher Scientific, Certified ACS Plus, CAS Reg. 7664-93-9, diluted to 10 weight %):

- (T) 10% of the above "High Surface Area" abrasive, 0.05% BTA, 0.02% $KIO_3$.

BTA is benzotriazole (Fisher Scientific, Certified, CAS Reg. 98-88-4), KIO3 is potassium iodate (Fisher Scientific, Certified ACS, CAS Reg. 7758-05-6).

Copper and tantalum material removal rate (MRR) was obtained using a Buehler-Vector/Phoenix Beta polishing system, type 60-1990 fitted with a Rodell IC1400 CMP pad, polishing cast metal disks 1.25 inches in diameter, approximately 0.75 inches thick. The pad and disk holder were set to rotate at 150 RPM. A polishing pressure of 5 pounds was applied to the metal disks. Slurry was pumped to the center of the pad at a rate of 60 ml/min. Removal rate was determined gravimetrically, weighing to the nearest 0.1 mg. MRR is expressed as Å/min.

Silicon oxide material removal rate (MRR) was obtained using a Westech 472 CMP polishing tool fitted with a Rodell IC1400 CMP pad, polishing 200 mm silicon wafers containing a PETEOS surface film. The pad was set to rotate at 60 RPM, while the wafer carrier was set to rotate at 62 RPM. A down force of 5 psig was applied with a backpressure of 1 psig. Slurry flow rate was set at 190 ml/min. The wafers were polished for 30 seconds.

| MRR (Å/min) | Slurry S— "Low Surface Area" | Slurry T— "High Surface Area" |
| --- | --- | --- |
| Tantalum | 733 | 859 |
| Copper | 233 | 275 |
| PETEOS silicon oxide | 479 | 101 |

This example demonstrates the further utility of the silica abrasive system of the present invention to vary silicon oxide removal rate by controlling silica primary particle size (reflected in the difference in surface area). Together with controlling percent abrasive and $KIO_3$ in the formulation, it can be seen how the removal rates of copper, tantalum and silicon oxide can be separately and independently controlled.

Example 51

A precipitated silica slurry of the present invention prepared in accordance with the methods disclosed in prior examples suitable for formulation for copper (or copper alloy) and tantalum chemical mechanical planarization was obtained with the following properties: Nitrogen BET (5-point) 91 m²/g, CTAB 90 m²/g, 16.0 weight percent solids with a particle size distribution determined by laser light scattering as follows: average 0.17 microns, and 10 volume percent greater than 0.34 microns.

Another sample from the same silica powder was milled using a 0.28% solution of Carbopol EZ-2 (high molecular weight polyacrylic acid crosslinked with polyalkenyl polyether, available from BF Goodrich) adjusted to pH 4 as the continuous phase to obtain the following particles: Nitrogen BET (5-point) 91 m$^2$/g, CTAB 90 m$^2$/g, 16.6 weight percent solids with a particle size distribution determined by laser light scattering as follows: average 0.17 microns, and 10 volume percent greater than 0.35 microns.

To this slurry was added formulation components to produce the following slurries (expressed as weight percent active ingredient) and pH adjusted to 5.5 using KOH (Fisher Scientific, Certfied ACS, CAS Reg. 1310-58-3, diluted to 10 weight %) or H$_2$SO$_4$ (Fisher Scientific, Certified ACS Plus, CAS Reg. 7664-93-9, diluted to 10 weight %):

(U) 6% abrasive milled into water, 0.05% BTA, 0.02% KIO$_3$ (V) 6% abrasive milled into Carbopol, 0.05% BTA, 0.02% KIO$_3$ Copper and tantalum material removal rate (MRR) was obtained using a Buehler-Vector/Phoenix Beta polishing system, type 60-1990 fitted with a Rodell IC1400 CMP pad, polishing cast metal disks 1.25 inches in diameter, approximately 0.75 inches thick. The pad and disk holder were set to rotate at 150 RPM. A polishing pressure of 5 pounds was applied to the metal disks. Slurry was pumped to the center of the pad at a rate of 60 ml/min. Removal rate was determined gravimetrically, weighing to the nearest 0.1 mg. MRR is expressed as Å/min.

| MRR Å/min) | Slurry U | Slurry V |
|---|---|---|
| Tantalum | 699 | 670 |
| Copper | 325 | 296 |

This example demonstrates that the inclusion of polyacrylic acid has only a modest effect on the removal rates in slurries where KIO$_3$ is the oxidizing agent.

Example 52

A precipitated silica slurry of the present invention prepared in accordance with the methods disclosed in prior examples suitable for formulation of copper (or copper alloy) and tantalum chemical mechanical planarization was obtained with the following properties: Nitrogen BET (5-point) 132 m$^2$/g, CTAB 140 m$^2$/g, 16.0 weight percent solids with a particle size distribution determined by laser light scattering as follows: average 0.115 microns, and 10 volume percent greater than 0.177 microns.

To this slurry was added formulation components to produce the following slurries (expressed as weight percent active ingredient) and pH adjusted to 5.5 using KOH (Fisher Scientific, Certified ACS, CAS Reg. 1310-58-3, diluted to 10 weight %) or H$_2$SO$_4$ (Fisher Scientific, Certified ACS Plus, CAS Reg. 7664-93-9, diluted to 10 weight %):

(O) 13% abrasive:
  3250 g. abrasive slurry at 16% solids
  750 g. filtered deionized water
(P) 13% abrasive, 0.10% phytic acid
  2712.5 g. abrasive slurry at 16% solids
  626.0 g. filtered deionized water
  8.3 g. phytic acid solution (Fluka, supplied as 40% solution in water)

Phytic acid (0.1 weight percent, from Fluka—supplied as 40% solution in water) was added to slurry of the current invention that was formulated for tantalum removal. Tantalum material removal rate (MRR) was obtained using an IPEC/Westech 472 polishing system, with a Rodel Politex CMP pad, polishing 200 mm-diameter silicon wafers coated on one side with 2000 Å tantalum films. Polish pressure was 3 psig, table speed was 60 RPM and carrier speed was 55 RPM. Slurry was supplied to the center of the pad at a rate of 200 g/min. Removal rate was determined using a Tencor RS75 4-point probe to measure tantalum film thickness before and after polishing. MRR is expressed as Å/min.

| MRR (Å/min) | Slurry w/o phytic acid | Slurry w/ phytic acid |
|---|---|---|
| Tantalum | 455 | 740 |

Example 53

A precipitated silica slurry of the present invention prepared in accordance with the methods disclosed in prior examples suitable for formulation of copper (or copper alloy) and tantalum chemical mechanical planarization was obtained with the following properties: Nitrogen BET (5-point) 132 m$^2$/g, CTAB 140 m$^2$/g, 16.0 weight percent solids with a particle size distribution determined by laser light scattering as follows: average 0.115 microns, and 10 volume percent greater than 0.177 microns.

To this slurry was added formulation components to produce the following slurries (expressed as weight percent active ingredient) and pH adjusted to 5.0 using KOH (Fisher Scientific, Certified ACS, CAS Reg. 1310-58-3, diluted to 10 weight %) or H$_2$SO$_4$ (Fisher Scientific, Certified ACS Plus, CAS Reg. 7664-93-9, diluted to 10 weight %):

(Q) 5.75% abrasive, 0.002% ammonium lauryl sulfate, 0.5% GOODRITE K-702 polyacrylic acid, 0.45% KOH, 2% hydrogen peroxide:
  28.75.0 g. abrasive slurry at 16% solids
  140.0 g. picolinic acid
  16.0 g. ammonium lauryl sulfate solution (Aldrich, supplied as 30% solution in water, further diluted to 1% solution in water)
  160.0 g. GOODRITE K-702 (Noveon Canada, Inc., supplied as 25% solution of polyacrylic acid in water)
  360.0 g. KOH solution (10% solution in water)
  533.0 g. hydrogen peroxide solution (Fisher Scientific, supplied as 30% hydrogen peroxide in water)
  3916.3 g. filtered deionized water
(R) 5.74% abrasive, 0.002% ammonium lauryl sulfate, 0.5% Noveon K702 polyacrylic acid, 0.45% KOH, 0.10% phytic acid, 2% hydrogen peroxide
  3489.5 g. Slurry (Q) from above
  8.8 g. phytic-acid solution (Fluka, supplied as 40% solution in water)

Phytic acid (0.1 weight percent, from Fluka—supplied as 40% solution in water) was added to slurry of the current invention that was formulated for copper removal and contained 1.75 weight percent picolinic acid. Copper material removal rate (MRR) was obtained using an IPEC/Westech 472 polishing system, with a Rodel IC1000/SUBA IV CMP pad, polishing 200 mm-diameter silicon wafers coated on one side with 15000 Å CVD copper films. Polish pressure was 3 psig, table speed was 65 RPM and carrier speed was 60 RPM. Slurry was supplied to the center of the pad at a rate of 150 g/min. Removal rate was determined using a Tencor RS75 4-point probe to measure tantalum film thickness before and after polishing. MRR is expressed as Å/min.

| MRR (Å/min) | Slurry w/o phytic acid | Slurry w phytic acid |
|---|---|---|
| Copper | 4703 | 6406 |

The invention claimed is:

1. A slurry for chemical mechanical planarization of a substrate comprising silica having an aggregate of primary particles, said aggregate having an aggregate size of less than one (1) micron, and said silica having an DHP oil absorption value of at least 150 milliliters per 100 grams of silica.

2. A silica comprising:
   (a) an aggregate of primary particles, said primary particles having an average diameter of at least fifteen (15) nanometers, wherein said aggregate has an aggregate size of less than one (1) micron; and
   (b) a hydroxyl content of at least seven (7) hydroxyl groups per nanometer squared.

3. A silica comprising:
   (a) an aggregate of primary particles, said primary particles having an average diameter of at least seven (7) nanometers, wherein said aggregate has an aggregate size of less than one (1) micron; and
   (b) a hydroxyl content of at least ten (10) hydroxyl groups per nanometer squared.

4. The silica of claim 3 wherein said hydroxyl content is at least fifteen (15) hydroxyl groups per nanometer squared.

5. A slurry composition comprising:
   (a) silica having an aggregate of primary particles, said primary particles having an average diameter of at least fifteen (15) nanometers, said aggregate having an aggregate size of less than one (1) micron, and said silica having a hydroxyl content of at least seven (7) hydroxyl groups per nanometer squared; and
   (b) a liquid.

6. A slurry composition comprising:
   (a) silica having an aggregate of primary particles, said primary particles having an average diameter of at least seven (7) nanometers, said aggregate having an aggregate size of less than one (1) micron, and said silica having a hydroxyl content of at least ten (10) hydroxyl groups per nanometer squared; and
   (b) a liquid.

7. The slurry composition of claim 6 wherein said hydroxyl content is at least fifteen (15) hydroxyl groups per nanometer squared.

8. A slurry composition comprising:
   (a) silica having an aggregate of primary particles, said primary particles having an average diameter of at least seven (7) nanometers, said aggregate having an aggregate size of less than one (1) micron, and said silica having a hydroxyl content of at least seven (7) hydroxyl groups per nanometer squared;
   (b) a liquid; and
   (c) oxidizing agent selected from inorganic and organic per-compounds, bromic acid, chloric acid, nitrates, sulfates, or mixtures thereof.

9. The slurry composition of claim 8 wherein said oxidizing agent is selected from urea-hydrogen peroxide, hydrogen peroxide, or a mixture thereof.

10. A slurry composition comprising:
    (a) silica having an aggregate of primary particles, said primary particles having an average diameter of at least seven (7) nanometers, said aggregate having an aggregate size of less than one (1) micron, and said silica having a hydroxyl content of at least seven (7) hydroxyl groups per nanometer squared;
    (b) a liquid;
    (c) polyvalent cation sequestrant; and
    (d) corrosion inhibitor.

11. The slurry composition of claim 10 wherein said polyvalent cation sequestrant is selected from carboxylic acids, polycarboxylic acids, amino acids, polyamino acids, dipeptides, polyimines, phosphoric acids, polyphosphoric acids, or mixtures thereof.

12. The slurry composition of claim 10 wherein said polyvalent cation sequestrant is selected from glycine, histidine, phytic acid, or mixtures thereof.

13. The slurry composition of claim 10 wherein said corrosion inhibitor is selected from polycarboxylic acids, polyamino acids, amino acids, imines, azoles, carboxylated azoles, mercaptans, or mixtures thereof.

14. The slurry composition of claim 10 wherein said corrosion inhibitor is selected from histidine, phytic acid or a mixture thereof.

15. The slurry composition of claim 10 further comprising a thickener.

16. A slurry composition comprising:
    (a) silica having an aggregate of primary particles, said primary particles having an average diameter of at least seven (7) nanometers, said aggregate having an aggregate size of less than one (1) micron, and said silica having a hydroxyl content of at least seven (7) hydroxyl groups per nanometer squared;
    (b) a liquid; and
    (c) phytic acid.

17. A slurry for polishing a microelectronic substrate, said slurry comprising precipitated silica having an aggregate of primary particles, said primary particles having an average diameter of at least seven (7) nanometers, wherein said aggregate has an aggregate size of less than one (1) micron, and a hydroxyl content of at least seven (7) hydroxyl groups per nanometer squared, wherein said slurry provides a removal of at least one material selected from copper, tantalum and silicon dioxide from said microelectronic substrate.

18. The slurry of claim 17 wherein rate of removal of tantalum is equal to or greater than rate of removal of copper.

19. The slurry of claim 17 wherein said silica has a BET to CTAB ratio of at least 1.2 or greater.

* * * * *